(12) United States Patent
Pauley et al.

(10) Patent No.: US 7,839,645 B2
(45) Date of Patent: Nov. 23, 2010

(54) MODULE HAVING AT LEAST TWO SURFACES AND AT LEAST ONE THERMALLY CONDUCTIVE LAYER THEREBETWEEN

(75) Inventors: Robert S. Pauley, Mission Viejo, CA (US); Jayesh R. Bhakta, Cerritos, CA (US); William M. Gervasi, Ladera Ranch, CA (US); Chi She Chen, Walnut, CA (US); Jose Delvalle, Costa Mesa, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

(21) Appl. No.: 12/606,136

(22) Filed: Oct. 26, 2009
(Under 37 CFR 1.47)

(65) Prior Publication Data

US 2010/0110642 A1 May 6, 2010

Related U.S. Application Data

(63) Continuation of application No. 12/052,678, filed on Mar. 20, 2008, now Pat. No. 7,630,202, which is a continuation of application No. 11/775,125, filed on Jul. 9, 2007, now Pat. No. 7,375,970, which is a continuation of application No. 11/101,155, filed on Apr. 7, 2005, now Pat. No. 7,254,036.

(60) Provisional application No. 60/561,009, filed on Apr. 9, 2004, provisional application No. 60/589,777, filed on Jul. 21, 2004.

(51) Int. Cl.
*H05K 7/20* (2006.01)
(52) U.S. Cl. .................. 361/721; 361/704; 361/719; 361/720; 165/80.3
(58) Field of Classification Search ............ None
See application file for complete search history.

(56) References Cited

U.S. PATENT DOCUMENTS 3,268,772 A    8/1966   Kamei et al.

(Continued)

FOREIGN PATENT DOCUMENTS

JP          05-335695        12/1993

(Continued)

OTHER PUBLICATIONS

Shawn Hall et al., "Low Cost, High Performance Heatsinks for Closely Spaced Dimms," presentation to JEDEC, Dec. 5, 2006.

*Primary Examiner*—Boris L Chervinsky
(74) *Attorney, Agent, or Firm*—Knobbe, Martens, Olson & Bear, LLP

(57) ABSTRACT

A module is electrically connectable to a computer system. The module includes a plurality of electrical contacts which are electrically connectable to the computer system. The module further includes a first surface and a first plurality of circuits coupled to the first surface. The first plurality of circuits is in electrical communication with the electrical contacts. The module further includes a second surface and a second plurality of circuits coupled to the second surface. The second plurality of circuits is in electrical communication with the electrical contacts. The second surface faces the first surface. The module further includes at least one thermally conductive layer positioned between the first surface and the second surface. The at least one thermally conductive layer is in thermal communication with the first plurality of circuits, the second plurality of circuits, and a first set of the plurality of electrical contacts.

20 Claims, 17 Drawing Sheets

U.S. PATENT DOCUMENTS

| | | |
|---|---|---|
| 3,893,161 A | 7/1975 | Pesak |
| 4,535,385 A | 8/1985 | August et al. |
| 4,628,407 A | 12/1986 | August et al. |
| 4,849,858 A | 7/1989 | Grapes et al. |
| 4,867,235 A | 9/1989 | Grapes et al. |
| 4,872,505 A | 10/1989 | Jones et al. |
| 4,887,353 A | 12/1989 | Preputnick |
| 5,060,113 A | 10/1991 | Jacobs |
| 5,109,318 A | 4/1992 | Funari et al. |
| 5,229,916 A | 7/1993 | Frankeny et al. |
| 5,244,023 A | 9/1993 | Spies |
| 5,313,097 A | 5/1994 | Haj-Ali-Ahmadi et al. |
| 5,343,359 A | 8/1994 | Morton et al. |
| 5,432,913 A | 7/1995 | Smits et al. |
| 5,445,869 A | 8/1995 | Ishikawa et al. |
| 5,513,135 A | 4/1996 | Dell et al. |
| 5,731,633 A | 3/1998 | Clayton |
| 5,739,687 A | 4/1998 | Hanley |
| 5,751,553 A | 5/1998 | Clayton |
| 5,754,409 A | 5/1998 | Smith |
| 5,784,263 A | 7/1998 | Nelson |
| 5,812,374 A | 9/1998 | Shuff |
| 5,892,658 A | 4/1999 | Urda et al. |
| 5,901,781 A | 5/1999 | Arai et al. |
| 5,949,650 A | 9/1999 | Bulante et al. |
| 5,949,657 A | 9/1999 | Karabatsos |
| 5,966,287 A | 10/1999 | Lofland et al. |
| 5,986,887 A | 11/1999 | Smith et al. |
| 6,021,048 A | 2/2000 | Smith |
| 6,025,992 A | 2/2000 | Dodge et al. |
| 6,049,975 A | 4/2000 | Clayton |
| 6,064,575 A | 5/2000 | Urda et al. |
| 6,091,145 A | 7/2000 | Clayton |
| 6,104,613 A | 8/2000 | Urda et al. |
| 6,151,215 A | 11/2000 | Hoffman |
| 6,157,541 A | 12/2000 | Hacke |
| 6,173,382 B1 | 1/2001 | Dell et al. |
| 6,180,881 B1 | 1/2001 | Isaak |
| 6,201,700 B1 | 3/2001 | Tzimares et al. |
| 6,208,517 B1 | 3/2001 | Prince et al. |
| 6,222,739 B1 | 4/2001 | Bhakta et al. |
| 6,232,659 B1 | 5/2001 | Clayton |
| 6,297,960 B1 | 10/2001 | Moden et al. |
| 6,381,140 B1 | 4/2002 | Liao |
| 6,392,305 B1 | 5/2002 | Huang et al. |
| 6,423,909 B1 | 7/2002 | Haynie et al. |
| 6,424,532 B2 | 7/2002 | Kawamura |
| 6,444,921 B1 | 9/2002 | Wang et al. |
| 6,449,159 B1 | 9/2002 | Haba |
| 6,507,912 B1 | 1/2003 | Matyas, Jr. et al. |
| 6,510,100 B2 | 1/2003 | Grundon et al. |
| 6,525,943 B2 | 2/2003 | Moden et al. |
| 6,535,387 B2 | 3/2003 | Summers et al. |
| 6,576,992 B1 | 6/2003 | Cady et al. |
| 6,590,282 B1 | 7/2003 | Wang et al. |
| 6,713,854 B1 | 3/2004 | Kledzik et al. |
| 6,740,821 B1 | 5/2004 | Jiang et al. |
| 6,757,751 B1 | 6/2004 | Gene |
| 6,760,224 B2 | 7/2004 | Moden et al. |
| 6,762,942 B1 | 7/2004 | Smith |
| 6,765,797 B2 | 7/2004 | Summers et al. |
| 6,833,984 B1 | 12/2004 | Belgacem |
| 6,956,284 B2 | 10/2005 | Cady et al. |
| 7,023,701 B2 | 4/2006 | Stocken et al. |
| 7,053,478 B2 | 5/2006 | Roper et al. |
| 7,079,396 B2 | 7/2006 | Gates et al. |
| 7,094,632 B2 | 8/2006 | Cady et al. |
| 7,106,595 B2 | 9/2006 | Foster et al. |
| 7,181,167 B2 | 2/2007 | Onggosanusi et al. |
| 7,254,036 B2 | 8/2007 | Pauley et al. |
| 7,289,327 B2 | 10/2007 | Goodwin et al. |
| 7,304,842 B2 | 12/2007 | Yatskov |
| 7,375,970 B2 | 5/2008 | Pauley et al. |
| 7,474,529 B2 | 1/2009 | Tian et al. |
| 7,619,893 B1 | 11/2009 | Yu |
| 7,630,202 B2 | 12/2009 | Pauley et al. |
| 2002/0076959 A1 | 6/2002 | Lee |
| 2002/0125039 A1 | 9/2002 | Marketkar et al. |
| 2003/0116835 A1 | 6/2003 | Miyamoto et al. |
| 2003/0234443 A1 | 12/2003 | Partridge et al. |
| 2004/0218367 A1 | 11/2004 | Lin et al. |
| 2004/0229402 A1 | 11/2004 | Cady et al. |
| 2004/0236877 A1 | 11/2004 | Burton |
| 2004/0262737 A1 | 12/2004 | Haba |
| 2005/0018412 A1 | 1/2005 | Roper et al. |
| 2005/0047776 A1 | 3/2005 | Watanabe et al. |
| 2005/0057911 A1 | 3/2005 | Rapport et al. |
| 2005/0078457 A1 | 4/2005 | Hsieh et al. |
| 2005/0146031 A1 | 7/2005 | Partridge et al. |
| 2005/0242423 A1 | 11/2005 | Partridge et al. |
| 2005/0259504 A1 | 11/2005 | Murtugh et al. |
| 2005/0263911 A1 | 12/2005 | Igarashi et al. |
| 2005/0289287 A1 | 12/2005 | Shin et al. |
| 2006/0020740 A1 | 1/2006 | Bartley et al. |
| 2006/0048385 A1 | 3/2006 | Cady et al. |
| 2006/0049500 A1 | 3/2006 | Goodwin |
| 2006/0049502 A1 | 3/2006 | Goodwin et al. |
| 2006/0049512 A1 | 3/2006 | Goodwin |
| 2006/0049513 A1 | 3/2006 | Goodwin |
| 2006/0050488 A1 | 3/2006 | Goodwin |
| 2006/0050489 A1 | 3/2006 | Wehrly, Jr. et al. |
| 2006/0050492 A1 | 3/2006 | Goodwin et al. |
| 2006/0050496 A1 | 3/2006 | Goodwin |
| 2006/0050497 A1 | 3/2006 | Goodwin |
| 2006/0050498 A1 | 3/2006 | Cady et al. |
| 2006/0050592 A1 | 3/2006 | Cady et al. |
| 2006/0053345 A1 | 3/2006 | Goodwin |
| 2006/0083043 A1 | 4/2006 | Cypher |
| 2006/0090102 A1 | 4/2006 | Wehrly, Jr. et al. |
| 2006/0090119 A1 | 4/2006 | Dong et al. |
| 2006/0091529 A1 | 5/2006 | Wehrly, Jr. et al. |
| 2006/0095592 A1 | 5/2006 | Borkenhagen |
| 2006/0111866 A1 | 5/2006 | LeClerg et al. |
| 2006/0125067 A1 | 6/2006 | Wehrly, Jr. et al. |
| 2006/0129888 A1 | 6/2006 | Szewerenko et al. |
| 2006/0198238 A1 | 9/2006 | Partridge et al. |
| 2006/0203442 A1 | 9/2006 | Goodwin |
| 2006/0250780 A1 | 11/2006 | Goodwin |
| 2006/0261449 A1 | 11/2006 | Rapport et al. |
| 2007/0111606 A1 | 5/2007 | Goodwin |
| 2007/0115017 A1 | 5/2007 | Goodwin et al. |
| 2007/0126124 A1 | 6/2007 | Rapport et al. |
| 2007/0126125 A1 | 6/2007 | Rapport et al. |
| 2007/0139897 A1 | 6/2007 | RaghuRam |
| 2007/0201208 A1 | 8/2007 | Goodwin et al. |
| 2008/0116571 A1 | 5/2008 | Dang |
| 2008/0123300 A1 | 5/2008 | Tian et al. |

FOREIGN PATENT DOCUMENTS

| | | |
|---|---|---|
| JP | 2821315 | 11/1998 |
| JP | 2001077294 | 3/2001 |
| JP | 2003086760 | 3/2003 |
| JP | 2003086761 | 3/2003 |

MODULE HAVING AT LEAST TWO SURFACES AND AT LEAST ONE THERMALLY CONDUCTIVE LAYER THEREBETWEEN

CLAIM OF PRIORITY

The present application is a continuation of U.S. patent application Ser. No. 12/052,678, filed Mar. 20, 2008, which is incorporated in its entirety by reference herein, which is a continuation of U.S. patent application Ser. No. 11/775,125, filed Jul. 9, 2007, which is incorporated in its entirety by reference herein, and which is a continuation of U.S. Pat. No. 7,254,036, filed Apr. 7, 2005, which is incorporated in its entirety by reference herein and which claims the benefit of U.S. Provisional Appl. No. 60/561,009, filed Apr. 9, 2004, and U.S. Provisional Appl. No. 60/589,777, filed Jul. 21, 2004, each of which is incorporated in its entirety by reference herein.

BACKGROUND OF THE INVENTION

1. Field of the Invention

The present invention relates generally to computer modules having a plurality of components mounted on two or more stacked printed circuit boards, and more specifically to high density memory modules using stacked printed circuit boards with heat dissipation structures.

2. Description of the Related Art

Computer systems often utilize modules comprising one or more printed circuit boards (PCBs). Each PCB has one or more components (e.g., integrated circuits or ICs) mounted thereon, and the components can be mounted on one side or on both sides of the PCB. In certain computer systems, the PCBs of the module are stacked next to one another to increase the functionality of the module. For example, board stacking is a method used to increase the memory density in memory subsystems. The technique is also used to increase the device density of other components, such as logic. Stacking enhances the capability of the module, particularly if components are assembled on each of the two sides of each of the stacked PCBs. In such configurations, the components mounted on one side of one PCB are positioned in close proximity to the components mounted on a neighboring side of a neighboring PCB.

Stacking configurations can cause problems due to power dissipation in the components which are in close proximity. Some or all of the components can generate significant amounts of heat, which can raise the temperature of the component itself or of the surrounding components of the module. The narrow air gap between the components on either side of the stacked PCBs prevents air flow which would otherwise keep the components within their specified operating temperature ranges. The raised temperature of these components can have harmful effects on the performance of the components, causing them to malfunction.

Prior art systems utilize heat spreaders to radiate the heat away from the heat-generating component and away from the surrounding components of the module. Such prior art heat spreaders are mounted over the heat-generating components. In stacked configurations, the prior art heat spreaders are typically mounted over components on an outside surface of the PCB (i.e., a surface away from a neighboring PCB). While these prior art heat spreaders can dissipate heat generated by the components on the outside surface of the PCB, components on the inside surfaces would remain hot. In addition, the components on the outside surface of the PCB are effectively cooled by air flowing across the components from a ventilation fan. However, the narrow air gap between the stacked PCBs would allow very little cool air from the ventilation fan to cool the components on the inside surfaces to within the specified operating temperatures.

SUMMARY OF THE INVENTION

In certain embodiments, a module is electrically connectable to a computer system. The module comprises at least one multilayer structure having a plurality of electrical contacts which are electrically connectable to the computer system. The module further comprises a first printed circuit board coupled to the at least one multilayer structure. The first printed circuit board has a first surface and a first plurality of components mounted on the first surface. The first plurality of components is in electrical communication with the electrical contacts. The module further comprises a second printed circuit board coupled to the at least one multilayer structure. The second printed circuit board has a second surface and a second plurality of components mounted on the second surface. The second plurality of components is in electrical communication with the electrical contacts. The second surface of the second printed circuit board faces the first surface of the first printed circuit board. The module further comprises at least one thermally conductive layer positioned between the first plurality of components and the second plurality of components. The at least one thermally conductive layer is in thermal communication with the first plurality of components, the second plurality of components, and the electrical contacts.

In certain embodiments, a module is connectable to a computer system. The module comprises at least one multilayer structure connectable to the computer system. The module further comprises a first printed circuit board in electrical communication with the at least one multilayer structure. The first printed circuit board has a first surface and a first plurality of components mounted on the first surface. The first plurality of components is in electrical communication with the computer system when the at least one multilayer structure is connected to the computer system. The module further comprises a second printed circuit board in electrical communication with the at least one multilayer structure. The second printed circuit board has a second surface and a second plurality of components mounted on the second surface. The second plurality of components is in electrical communication with the computer system when the at least one multilayer structure is connected to the computer system. The second surface faces the first surface. The module further comprises a heat spreader comprising at least one sheet of thermally conductive material. The heat spreader is positioned between and in thermal communication with the first plurality of components and the second plurality of components. The heat spreader is in thermal communication with the computer system when the at least one multilayer structure is connected to the computer system.

In certain embodiments, a method conducts heat away from a first plurality of components mounted on a first surface of a first printed circuit board and from a second plurality of components mounted on a second surface of a second printed circuit board. The method comprises coupling the first printed circuit board and the second printed circuit board to at least one multilayer structure. The first surface faces the second surface. The method further comprises positioning a thermally conductive layer between the first plurality of components and the second plurality of components. The method further comprises thermally coupling the thermally conductive layer to the first plurality of components, to the second plurality of components, and to the at least one multilayer structure. The method further comprises electrically and thermally coupling the at least one multilayer structure to a computer system. A thermal pathway is provided for heat to be removed from the first plurality of components and from the second plurality of components to the computer system through the at least one multilayer structure.

In certain embodiments, a method fabricates a module electrically connectable to a computer system. The method comprises providing at least one multilayer structure comprising at least one layer of thermally conductive material which is thermally coupled to the computer system when the at least one multilayer structure is electrically connected to the computer system. The method further comprises mounting a first printed circuit board to the at least one multilayer structure. The first printed circuit board has a first surface and a first plurality of components mounted on the first surface. The first plurality of components is electrically coupled to the at least one multilayer structure and is thermally coupled to the at least one layer of thermally conductive material. The method further comprises mounting a second printed circuit board to the at least one multilayer structure. The second printed circuit board has a second surface and a second plurality of components mounted on the second surface. The second plurality of components is electrically coupled to the at least one multilayer structure and is thermally coupled to the at least one layer of thermally conductive material.

DETAILED DESCRIPTION OF EXEMPLARY EMBODIMENTS

Figure 1:
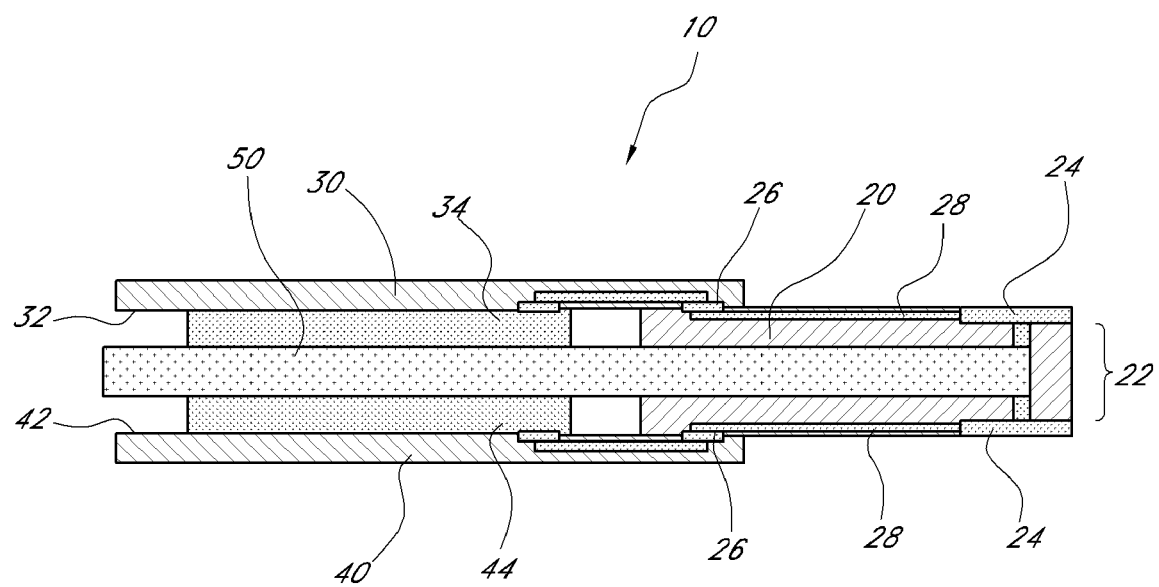
FIG. 1 schematically illustrates a cross-sectional view of a module in accordance with certain embodiments described herein.

FIG. 1 schematically illustrates a cross-sectional view of a module 10 in accordance with certain embodiments described herein. The module 10 comprises a frame 20 having an edge connector 22 with a plurality of electrical contacts 24 which are electrically connectable to a computer system (not shown). The module 10 further comprises a first printed circuit board (PCB) 30 coupled to the frame 20. The first PCB 30 has a first surface 32 and a first plurality of components 34 mounted on the first surface 32 and electrically coupled to the electrical contacts 24 of the edge connector 22. The module 10 further comprises a second PCB 40 coupled to the frame 20. The second PCB 40 has a second surface 42 and a second plurality of components 44 mounted on the second surface 42 and electrically coupled to the electrical contacts 24 of the edge connector 22. The second surface 42 of the second PCB 40 faces the first surface 32 of the first PCB 30. The module 10 further comprises at least one thermally conductive layer 50 positioned between the first plurality of components 34 and the second plurality of components 44. The at least one thermally conductive layer 50 is thermally coupled to the first plurality of components 34, to the second plurality of components 44, and to the electrical contacts 24 of the edge connector 22.

The frame 20 of certain embodiments comprises the edge connector 22 with the plurality of electrical contacts 24, and further comprises a plurality of electrical contacts 26 (e.g., pads or solder balls) which are electrically connectable to the first PCB 30 and the second PCB 40. In addition, the frame 20 of certain embodiments provides electrical conduits 28 from the electrical contacts 26 to the electrical contacts 24 of the edge connector 22. In certain embodiments, the electrical contacts 24 of the edge connector 22 are configured to be electrically connected to a corresponding socket of a PCB (e.g., motherboard) of the computer system. In certain embodiments, the electrical contacts 24 are on a single side of the frame 20, while in other embodiments, the electrical contacts 24 are on both sides of the frame 20, as schematically illustrated by FIG. 1. Exemplary materials for the electrical contacts 24, 26 and the electrical conduits 28 compatible with embodiments described herein include, but are not limited to, aluminum, copper, gold-plated copper, and other conductive metals and alloys. Persons skilled in the art can select appropriate materials and configurations for the electrical contacts 24 of the edge connector 22 and the corresponding socket in accordance with embodiments described herein. In addition, persons skilled in the art can select appropriate materials and configurations of the electrical contacts 26 and electrical conduits 28 in accordance with embodiments described herein.

In certain embodiments, the frame 20 further comprises the at least one thermally conductive layer 50 which is thermally coupled to the edge connector 22. In certain embodiments, the at least one thermally conductive layer 50 comprises copper (e.g., "two-ounce" copper sheet corresponding to an areal density of two ounces per square foot), aluminum, carbon, or another sufficiently thermally conductive material. In certain embodiments, the at least one thermally conductive layer 50 is substantially electrically conductive, while in other embodiments, the at least one thermally conductive layer 50 is substantially electrically insulative. While the embodiment schematically illustrated by FIG. 1 has one thermally conductive layer 50, other embodiments have two, three, four, or more thermally conductive layers 50. Generally, the thermal conductivity of the at least one thermally conductive layer 50 increases with increasing thickness of the at least one thermally conductive layer 50. The thickness of an exemplary thermally conductive layer 50 comprising copper is approximately 0.2 millimeter. Persons skilled in the art can select appropriate materials, thicknesses, and configurations for the at least one thermally conductive layer 50 in accordance with embodiments described herein.

In certain embodiments, the frame 20 comprises one or more PCBs which provide electrical conductivity from the edge connector 22 to the first PCB 30 and to the second PCB 40. One or more of the PCBs of the frame 20 of certain embodiments are multilayer structures formed by epoxy lamination of layers of electrically insulative materials and electrically conductive materials which form conductive traces, ground planes, voltage planes, embedded passive components, and vias. Examples of electrically insulative materials compatible with embodiments described herein include, but are not limited to, plastic, polyimide, fiberglass (e.g., FR4 material), and other dielectric materials. Examples of electrically conductive materials compatible with embodiments described herein include, but are not limited to, conductive polymers, conductive inks, copper, aluminum, and other metals and alloys. In certain embodiments, the electrically conductive material is deposited onto a dielectric layer (e.g., by copper clad processes as are known to persons skilled in the art). Persons skilled in the art can select appropriate materials and techniques to fabricate PCBs compatible with embodiments described herein.

Figure 2:
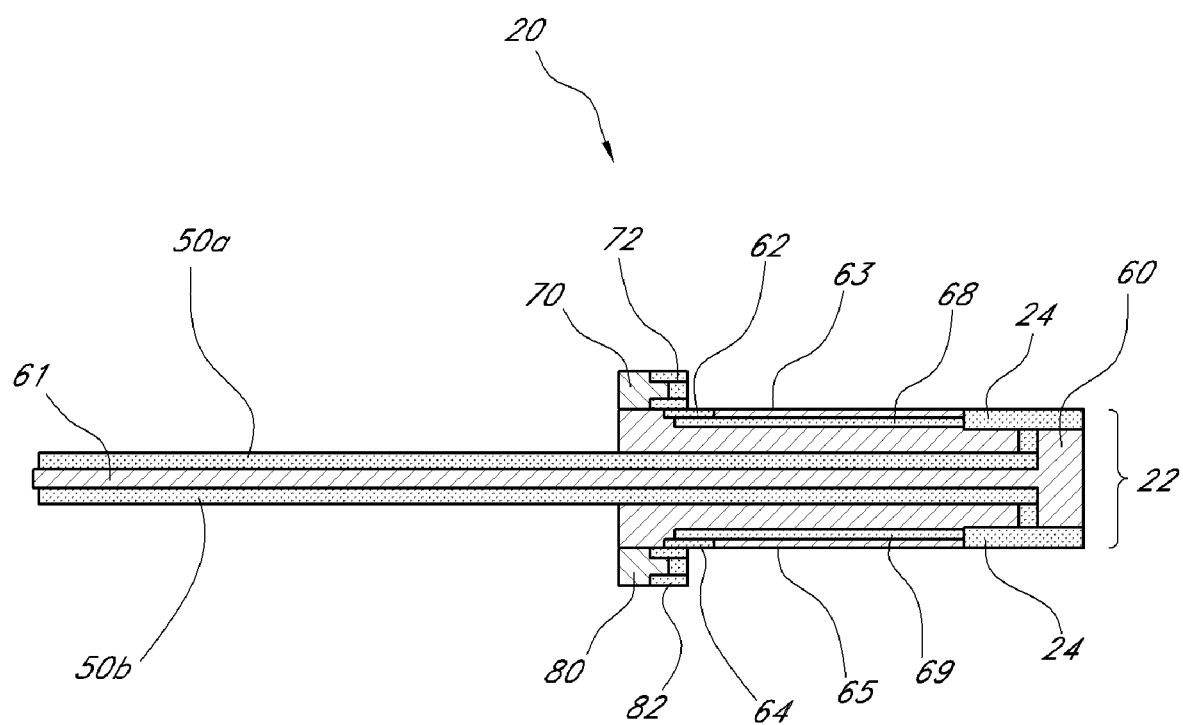
FIG. 2 schematically illustrates a cross-sectional view of an exemplary frame having multiple printed circuit boards (PCBs) in accordance with certain embodiments described herein.

FIG. 2 schematically illustrates a cross-sectional view of an exemplary frame 20 having multiple PCBs in accordance with certain embodiments described herein. In certain embodiments, the frame 20 comprises a base PCB 60, a first riser PCB 70, and a second riser PCB 80. Certain embodiments of the frame 20 comprise fewer than three PCBs, while other embodiments comprise more than three PCBs.

As schematically illustrated by FIG. 2, in certain embodiments, the base PCB 60 comprises the edge connector 22 and two thermally conductive layers 50a, 50b on either side of a dielectric layer 61. In certain embodiments in which the two thermally conductive layers 50a, 50b are electrically conductive, the dielectric layer 61 electrically insulates the two thermally conductive layers 50a, 50b from one another. The base PCB 60 of certain embodiments provides thermal conductivity between the thermally conductive layers 50a, 50b and the edge connector 22. In certain such embodiments, one thermally conductive layer 50a is thermally coupled to a first set of electrical contacts 24 of the edge connector 22 and the other thermally conductive layer 50b is thermally coupled to a second set of electrical contacts 24 of the edge connector 22.

The base PCB 60 of certain embodiments further comprises a first plurality of electrical contacts 62 at a first surface 63 of the base PCB 60 which are electrically coupled to the edge connector 22 by electrical conduits 68. The base PCB 60 of certain embodiments also comprises a second plurality of electrical contacts 64 at a second surface 65 of the base PCB 60 which are electrically coupled to the edge connector 22 by electrical conduits 69.

The first riser PCB 70 of certain embodiments comprises a third plurality of electrical contacts 72 which are electrically coupled to the first plurality of electrical contacts 62 of the base PCB 60 and which are electrically connectable to the first PCB 30. As described more fully below, the first riser PCB 70 has a thickness selected to space the first surface 32 of the first PCB 30 at a sufficient distance away from the base PCB 60 so that the first plurality of components 34 fit between the first surface 32 of the first PCB 30 and the at least one thermally conductive layer 50 of the base PCB 60. Similarly, the second riser PCB 80 of certain embodiments comprises a fourth plurality of electrical contacts 82 which are electrically coupled to the second plurality of electrical contacts 64 of the base PCB 60 and which are electrically connectable to the second PCB 40. As described more fully below, the second riser PCB 80 has a thickness selected to space the second surface 42 of the second PCB 40 at a sufficient distance away from the base PCB 60 so that the second plurality of components 44 fit between the second surface 42 of the second PCB 40 and the at least one thermally conductive layer 50 of the base PCB 60.

Figure 3A:
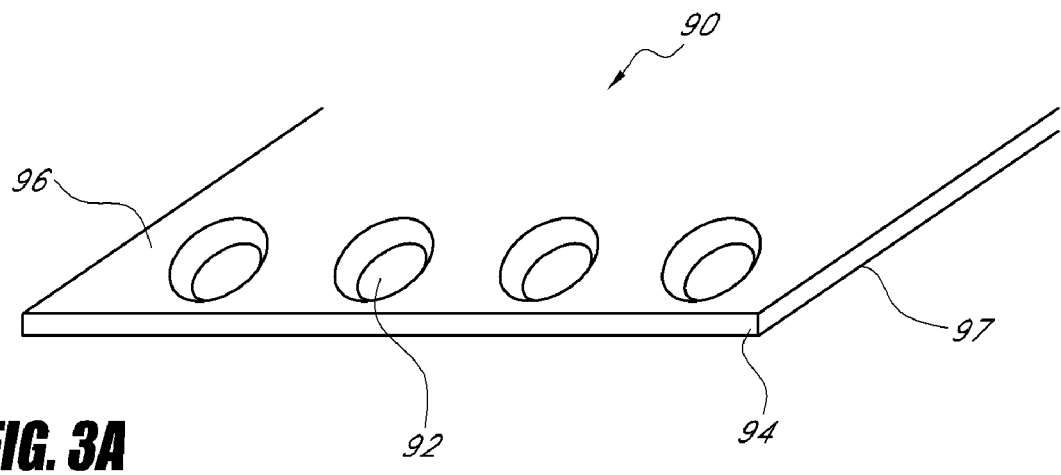
FIGS. 3A-3C schematically illustrate an exemplary process for forming a riser PCB in accordance with certain embodiments described herein.
Figure 3B:
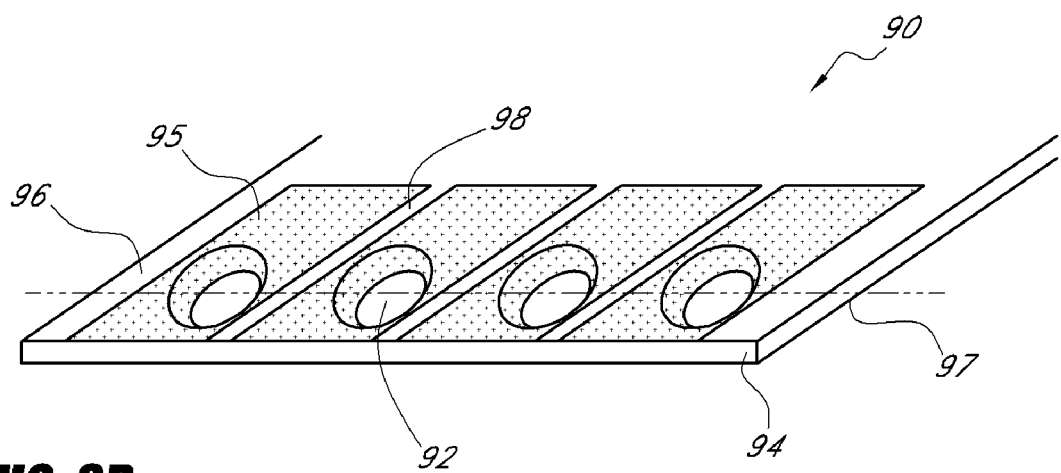
Figure 3C:
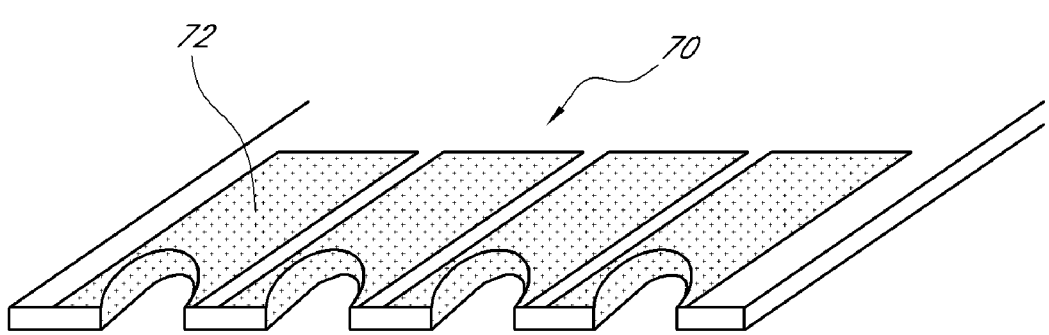

In certain embodiments, the first riser PCB 70 is formed by a process schematically illustrated by FIGS. 3A-3C. A PCB 90 is provided in which holes 92 are formed through the thickness of the PCB 90. The holes 92 are formed generally along an edge 94 of the PCB 90, as schematically illustrated by FIG. 3A. Persons skilled in the art can select appropriate methods of forming the holes 92 (e.g., laser drilling) in accordance with embodiments described herein. A plating layer 95 of a conductive material (e.g., copper) is then applied to the inside surface of each hole 92 and to an area on a top surface 96 of the PCB 90, as schematically illustrated by FIG. 3B, and to an area on a bottom surface 97 of the PCB 90. The portions of the plating layer 95 corresponding to the holes 92 are electrically insulated from one another (e.g., by spaces 98). Persons skilled in the art can select appropriate materials and methods (e.g., copper cladding, laser removal of extraneous plating material) for forming the plating layer 95 in accordance with embodiments described herein. The PCB 90 is then cut along a line generally parallel to the edge 94 and across the holes 92 (e.g., the dashed line of FIG. 3B). As schematically illustrated by FIG. 3C, the plated and cut holes 92 of the resultant structure of the first riser PCB 70 form the third plurality of electrical contacts 72 which are electrically coupled to the first plurality of electrical contacts 62 of the base PCB 60 and which are electrically connectable to the first PCB 30. A similar process is used to form the second riser PCB 80 and the fourth plurality of electrical contacts 82 in certain embodiments.

Figure 4A:
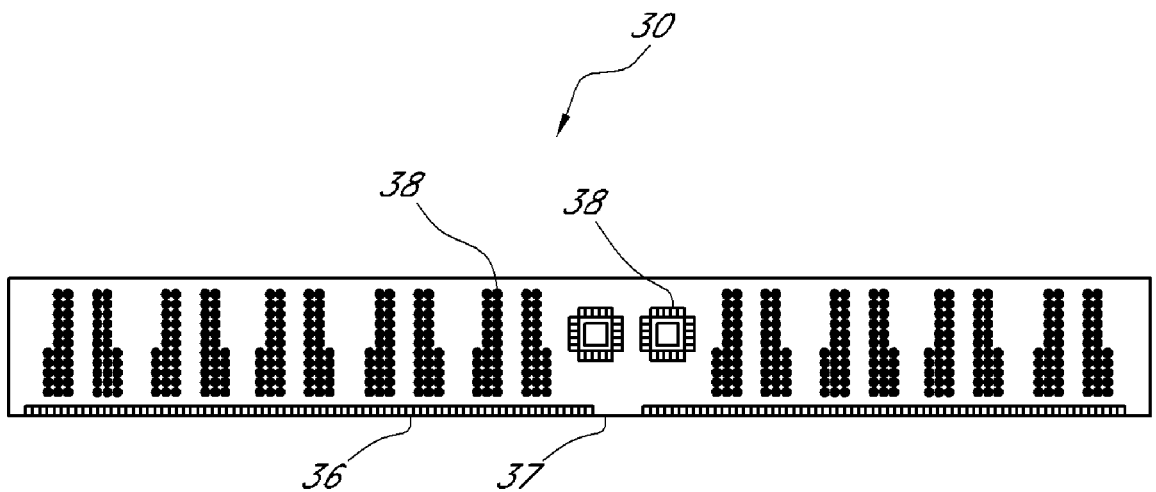
FIG. 4A schematically illustrates one side of an exemplary first PCB compatible with the exemplary frame schematically illustrated by FIG. 2.

FIG. 4A schematically illustrates one side of an exemplary first PCB 30 compatible with the exemplary frame 20 schematically illustrated by FIG. 2. In certain embodiments, the first PCB 30 comprises a plurality of electrical contacts 36 along an edge 37 of the first PCB 30. The plurality of electrical contacts 36 are electrically coupled to a plurality of component contacts 38 which are connectable to the first plurality of components 34. In certain embodiments, the plurality of electrical contacts 36 of the first PCB 30 are electrically connectable to the third plurality of electrical contacts 72 of the first riser PCB 70. In certain embodiments, the first PCB 30 is configured to have components 34 only on one side, while in other embodiments, the first PCB 30 is configured to have components 34 on both sides.

Figure 4B:
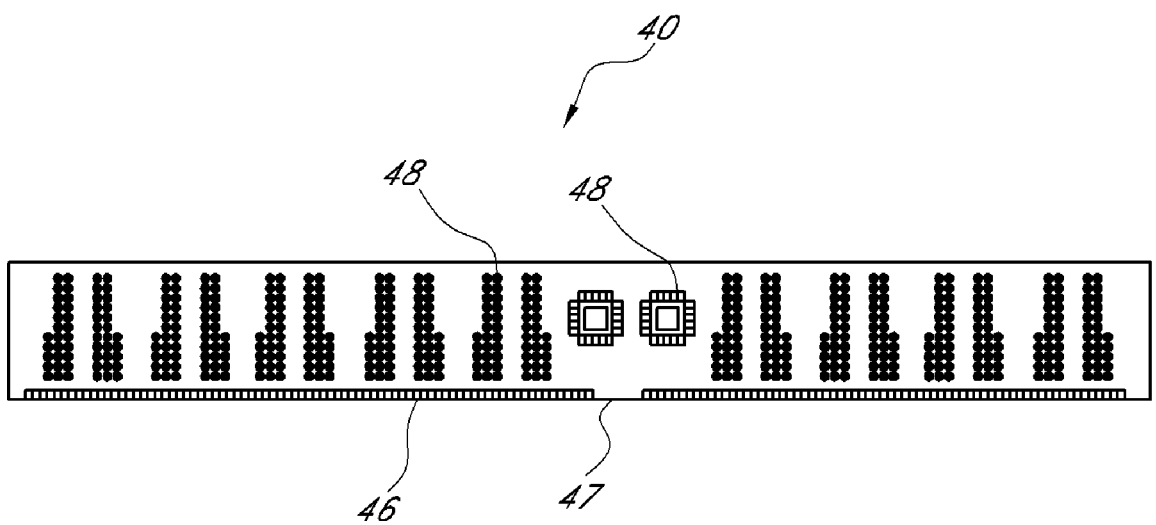
FIG. 4B schematically illustrates one side of an exemplary second PCB compatible with the exemplary frame schematically illustrated by FIG. 2.

Similarly, as schematically illustrated by FIG. 4B, an exemplary second PCB 40 comprises a plurality of electrical contacts 46 along an edge 47 of the second PCB 40, with the plurality of electrical contacts 46 electrically coupled to a plurality of component contacts 48 which are connectable to the second plurality of components 44. In certain embodiments, the plurality of electrical contacts 46 of the second PCB 40 are electrically connectable to the fourth plurality of electrical contacts 82 of the second riser PCB 80. In certain embodiments, the second PCB 40 is configured to have components 44 only on one side, while in other embodiments, the second PCB 40 is configured to have components 44 on both sides.

In certain embodiments, the first plurality of components 34 and/or the second plurality of components 44 comprises integrated circuits having packaging which include but are not limited to, thin small-outline package (TSOP), ball-grid-array (BGA), fine-pitch BGA (FBGA), micro-BGA (μBGA), mini-BGA (mBGA), and chip-scale packaging (CSP). Memory components 34, 44 compatible with embodiments described herein, including but not limited to, random-access memory (RAM), dynamic random-access memory (DRAM), synchronous DRAM (SDRAM), and double-data-rate DRAM (e.g., DDR-1, DDR-2, DDR-3). In certain such embodiments, as schematically illustrated by FIGS. 4A and 4B, the component contacts 38, 48 are configured to be electrically connected to memory devices having BGA packaging. In addition, the components 34, 44 of certain embodiments further comprise other types of integrated circuits or electrical components, including, but not limited to, registers, clocks, and microprocessors. In certain embodiments, at least some of the components 34 of the first PCB 30 are stacked (e.g., package stacked or die stacked) on one another, while in other embodiments, the components 34 of the first PCB 30 are not stacked on one another. In certain embodiments, at least some of the components 44 of the second PCB 40 are stacked (e.g., package stacked or die stacked), while in other embodiments, the components 44 of the second PCB 40 are not stacked.

Figure 5:
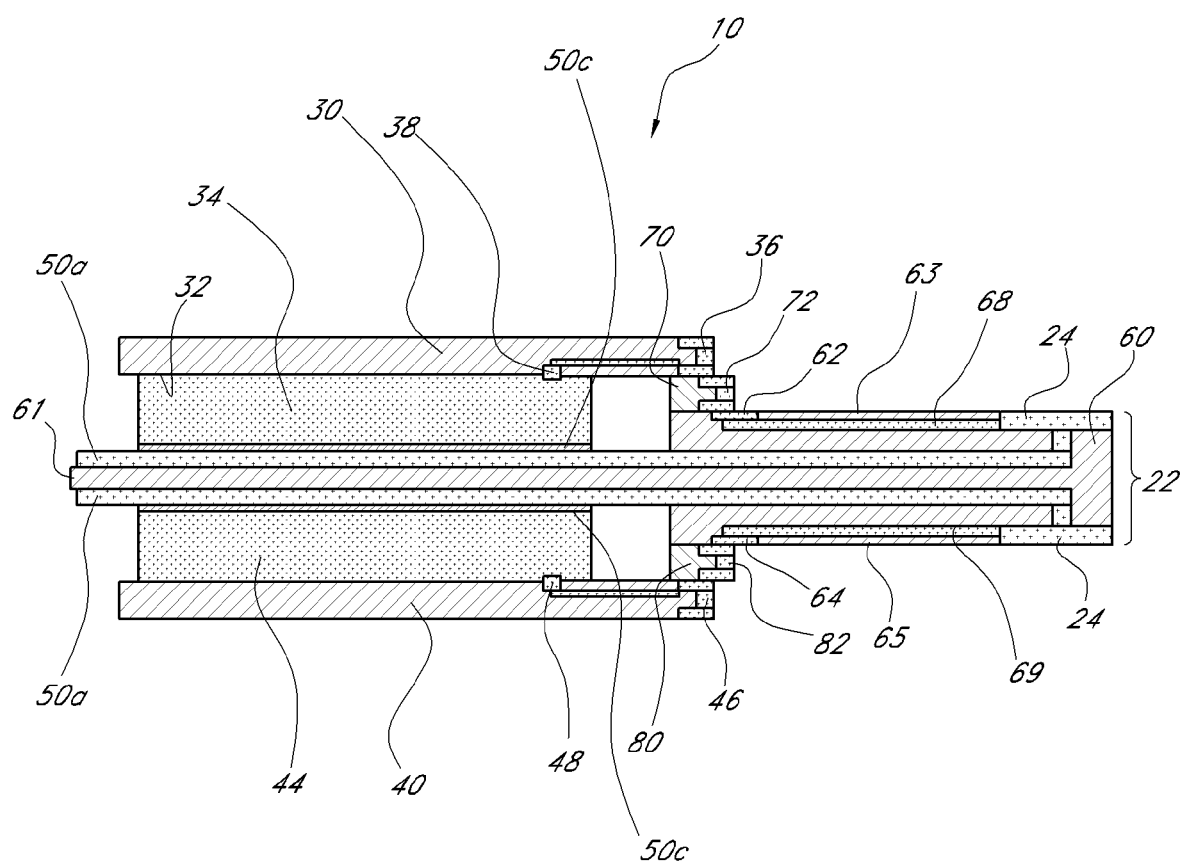
FIG. 5 schematically illustrates an exemplary module with the exemplary frame of FIG. 2, a first PCB with a first plurality of components on a first surface, and a second PCB with a second plurality of components on a second surface facing the first surface.

FIG. 5 schematically illustrates an exemplary module 10 with the exemplary frame 20 of FIG. 2, a first PCB 30 with a first plurality of components 34 on a first surface 32, and a second PCB 40 stacked with the first PCB 30. The second PCB 40 has a second plurality of components 44 on a second surface 42 facing the first surface 32. In certain embodiments, the first PCB 30 and the second PCB 40 are generally parallel to one another, while in other embodiments, the first PCB 30 and the second PCB 40 have a non-zero angle therebetween.

The first PCB 30 of FIG. 5 has component contacts 38 at the first surface 32 which are electrically connected to the corresponding components 34 and to the electrical contacts 36 at the end of the first PCB 30. As schematically illustrated by FIG. 5, the electrical contacts 36 of the first PCB 30 are electrically coupled to the electrical contacts 24 of the edge connector 22 through the electrical contacts 72 of the first riser PCB 70, through the electrical contacts 62 of the base PCB 60, and through the electrical conduits 68 of the base PCB 60. Similarly, the second PCB 40 of FIG. 5 has component contacts 48 at the second surface 42 which are electrically connected to the corresponding components 44 and to the electrical contacts 46 at the end of the second PCB 40. As schematically illustrated by FIG. 5, the electrical contacts 46 of the second PCB 40 are electrically coupled to the electrical contacts 24 of the edge connector 22 through the electrical contacts 82 of the second riser PCB 80, through the electrical contacts 64 of the base PCB 60, and through the electrical conduits 69 of the base PCB 60.

In the embodiment schematically illustrated by FIG. 5, the first plurality of components 34 are thermally coupled to the thermally conductive layer 50a which is thermally coupled to a portion of the electrical contacts 24 of the edge connector 22. Similarly, the second plurality of components 44 are thermally coupled to the thermally conductive layer 50b which is thermally coupled to a portion of the electrical contacts 24 of the edge connector 22.

In certain embodiments, at least some of the components 34, 44 are in contact with the least one thermally conductive layer 50, while in other embodiments, at least some of the components 34, 44 are spaced away from the at least one thermally conductive layer 50. In certain embodiments, the thickness of the first riser PCB 70 is selected to position the first surface 32 of the first PCB 30 at a desired distance from the thermally conductive layer 50a. Similarly, in certain embodiments, the thickness of the second riser PCB 80 is selected to position the second surface 42 of the second PCB 40 at a desired distance from the thermally conductive layer 50b. These distances between the at least one thermally conductive layer 50 and the first surface 32 and the second surface 42 are selected to provide sufficient thermal conductivity between the components 34, 44 and the at least one thermally conductive layer 50.

In certain embodiments, the at least one thermally conductive layer 50 comprises a layer of a thermally conductive grease 50c which contacts at least some of the components 34, 44 and a corresponding one of the at least one thermally conductive layers 50a, 50b. In certain such embodiments, the thermally conductive grease provides an improved thermal connection with the components 34, 44, thereby improving the heat transfer away from the components 34, 44. Persons skilled in the art can select an appropriate thermally conductive grease 50c in accordance with embodiments described herein.

Upon connection of the exemplary module 10 schematically illustrated by FIG. 5 to a socket of a computer system motherboard, the module 10 provides a path for heat transfer from the first plurality of components 34, through the thermally conductive grease 50c and the thermally conductive layer 50a, through the contacts 24 of the edge connector 22, to the motherboard. Similarly, the module 10 provides a path for heat transfer from the second plurality of components 44, through the thermally conductive grease 50c and the thermally conductive layer 50b, through the contacts 24 of the edge connector 22, to the motherboard. By providing a thermal path from the components 34, 44 through the edge connector 24 to the motherboard, certain embodiments advantageously do not utilize a separate thermal connection to other portions of the computer system (e.g., the chassis or enclosure) which may be inaccessible for this purpose. In addition, certain embodiments advantageously do not utilize separate heat spreaders on the outside surface of the module 10 which would otherwise increase the width of the module 10. The at least one thermally conductive layer 50, along with the electrical connections 24 of the edge connector 24 thereby serve as a heat spreader to dissipate heat from the components 34, 44.

Figure 6:
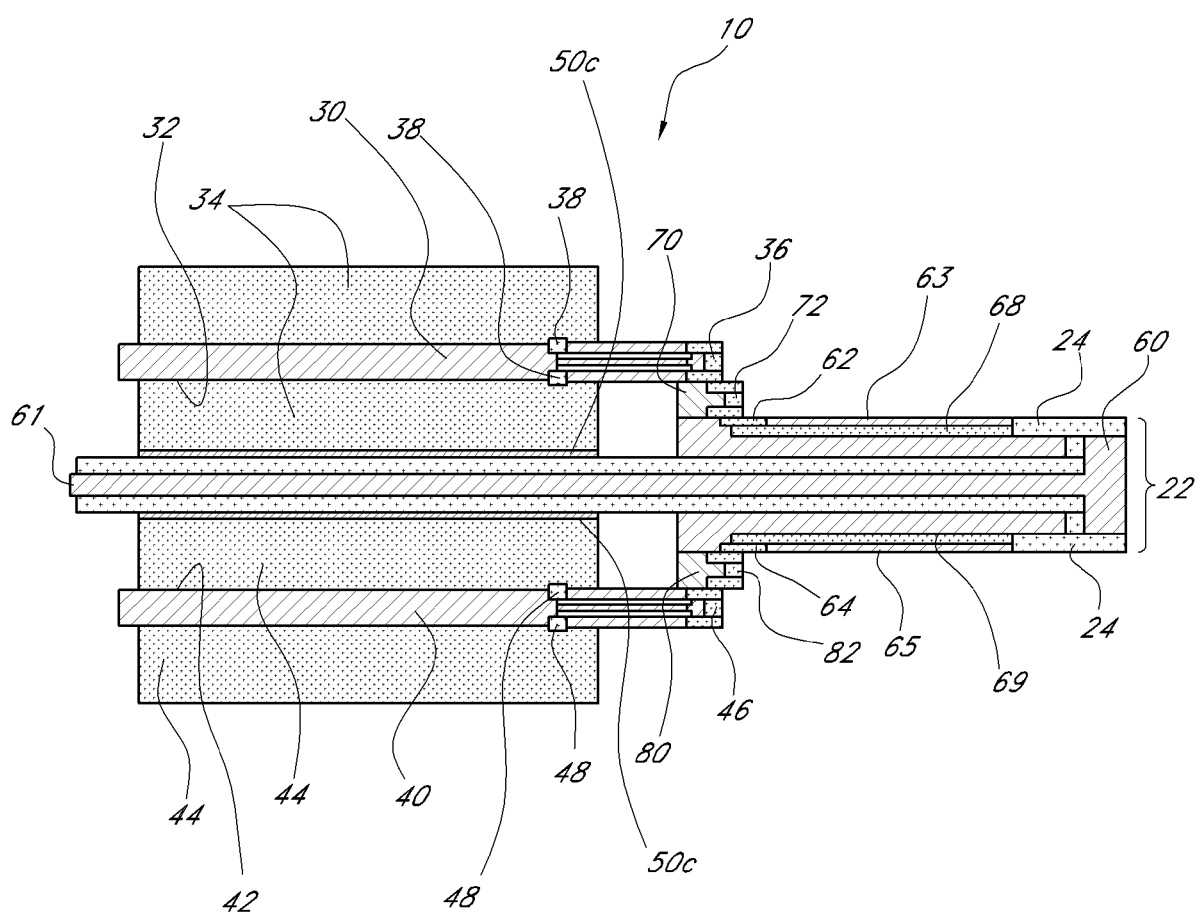
FIG. 6 schematically illustrates an exemplary module with the exemplary frame of FIG. 2, a first PCB with a first plurality of components on two surfaces, and a second PCB with a second plurality of components on two surfaces.

FIG. 6 schematically illustrates an exemplary module 10 with the exemplary frame 20 of FIG. 2, a first PCB 30 with a first plurality of components 34 on two surfaces, and a second PCB 40 with a second plurality of components 44 on two surfaces. The first PCB 30 of FIG. 6 has component contacts 38 at both surfaces which are electrically connected to the corresponding components 34 and to the electrical contacts 36 at the end of the first PCB 30. As schematically illustrated by FIG. 6, in certain embodiments, the components 34 on the first surface 32 of the first PCB 30 are thermally coupled to the thermally conductive layer 50a through a layer of thermally conductive grease 50c. In certain embodiments, the components 34 on the opposite surface of the first PCB 30 are not thermally coupled to the at least one thermally conductive layer 50, while in other embodiments, the components 34 on the opposite surface of the first PCB 30 are thermally coupled to the at least one thermally conductive layer 50. Similarly, the second PCB 40 of FIG. 6 has component contacts 48 at both surfaces which are electrically connected to the corresponding components 44 and to the electrical contacts 46 at the end of the first PCB 40. As schematically illustrated by FIG. 6, in certain embodiments, the components 44 on the second surface 42 of the second PCB 40 are thermally coupled to the thermally conductive layer 50b through a layer of thermally conductive grease 50c. In certain embodiments, the components 44 on the opposite surface of the second PCB 40 are not thermally coupled to the at least one thermally conductive layer 50, while in other embodiments, the components 44 on the opposite surface of the second PCB 40 are thermally coupled to the at least one thermally conductive layer 50.

Certain embodiments described herein advantageously provide stacked PCBs with improved thermal dissipation properties. Certain embodiments described herein advantageously provide memory modules with increased memory capacity while keeping the thickness of the memory module below a predetermined value. For example, for certain embodiments with components 34, 44 comprising DDR2 DRAM integrated circuits with BGA packaging on both sides of each of the first PCB 30 and the second PCB 40, the module 10 has a thickness of less than approximately 5.6 millimeters. Thus, certain embodiments advantageously allow use of the module 10 in cramped spaces. Certain embodiments advantageously reduce the cost of ventilation of the module 10. Certain embodiments advantageously maintain temperatures of the components 34, 44 within a desired operational temperature range.

Figure 7:
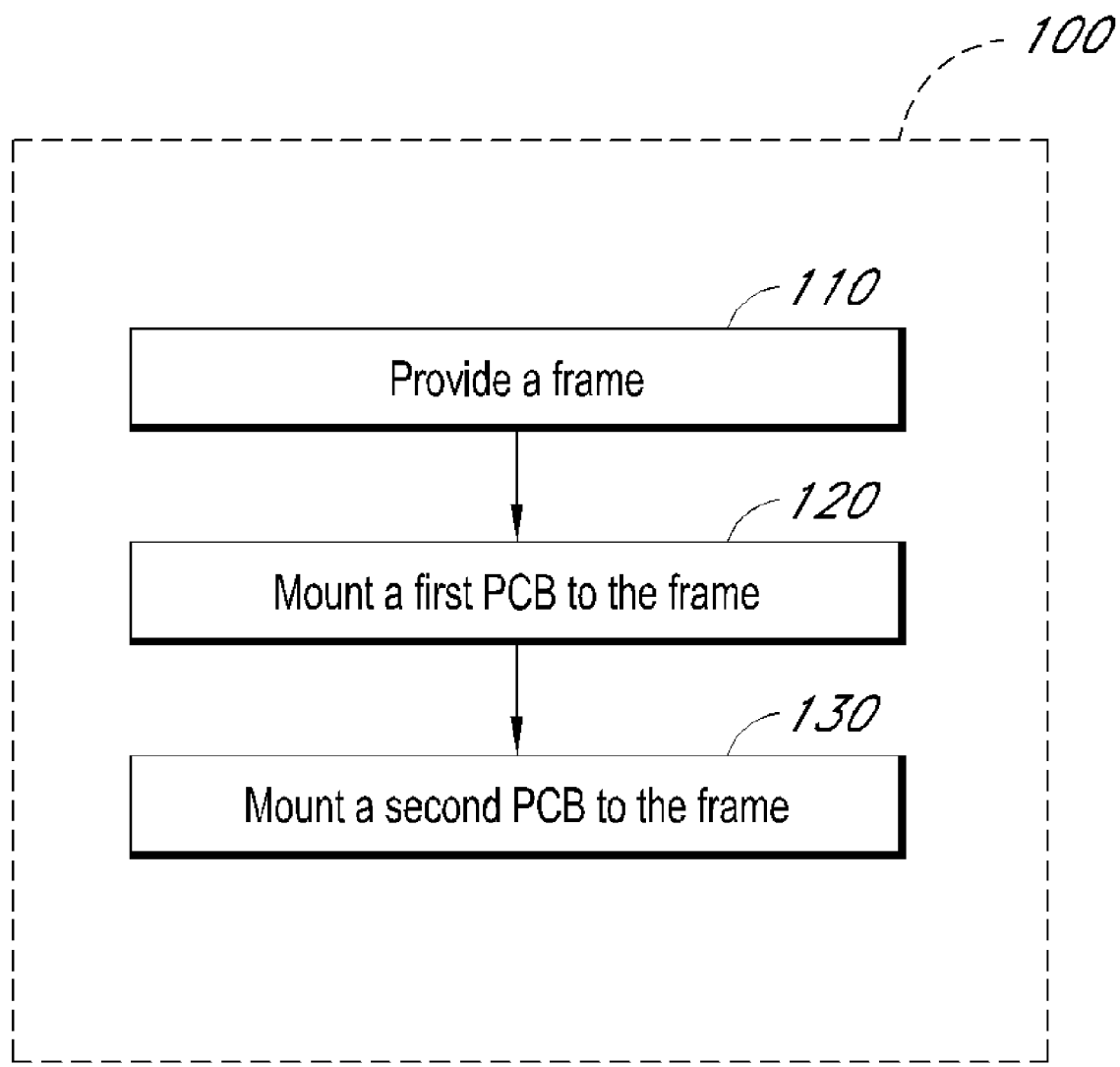
FIG. 7 is a flowchart of an exemplary method of fabricating a module which is electrically connectable to a computer system in accordance with certain embodiments described herein.

FIG. 7 is a flowchart of an exemplary method 100 of fabricating a module 10 which is electrically connectable to a computer system in accordance with certain embodiments described herein. While the discussion of the method 100 herein refers to the structures schematically illustrated by FIGS. 2, 5, and 6, persons skilled in the art recognize that other structures are also compatible with embodiments described herein. In an operational block 110, the method 100 comprises providing a frame 20 comprising an edge connector 22 which is electrically connectable to the computer system. The frame 20 further comprises at least one layer of thermally conductive material 50 which is thermally coupled to the edge connector 22. In an operational block 120, the method 100 further comprises mounting a first PCB 30 to the frame 20. The first PCB 30 has a first surface 32 and a first plurality of components 34 mounted thereon. The components 34 are electrically coupled to the edge connector 22 and thermally coupled to the at least one layer of thermally conductive material 50. In an operational block 130, the method 100 further comprises mounting a second PCB 40 to the frame 20. The second PCB 40 has a second surface 42 and a second plurality of components 44 mounted thereon. The components 44 are electrically coupled to the edge connector 22 and are thermally coupled to the at least one layer of thermally conductive material 50.

Figure 8:
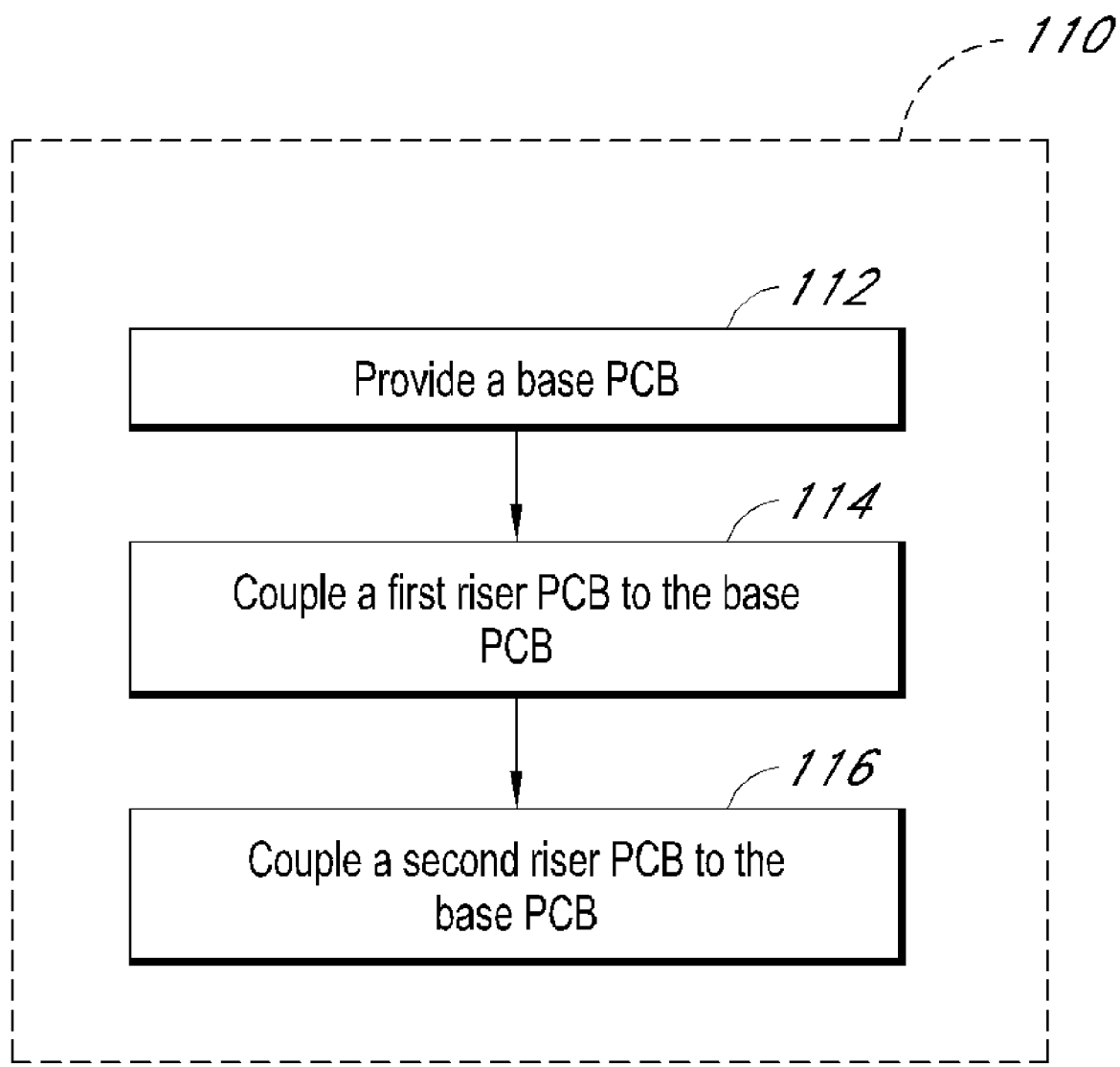
FIG. 8 is a flowchart of providing the frame in accordance with certain embodiments described herein.

FIG. 8 is a flowchart of providing the frame 20 in the operational block 110 in accordance with certain embodiments described herein. In an operational block 112, a base PCB 60 is provided, wherein the base PCB 60 comprises the edge connector 22, the at least one layer of thermally conductive material 50, a plurality of electrical contacts 62 at a first surface 63 of the base PCB 60, and a plurality of electrical contacts 64 at a second surface 65 of the base PCB 60. The electrical contacts 62, 64 are electrically coupled to the edge connector 22. In an operational block 114, a first riser PCB 70 comprising a plurality of electrical contacts 72 is coupled to the base PCB 60. In certain embodiments, coupling the first riser PCB 70 to the base PCB 60 comprises electrically coupling the electrical contacts 72 of the first riser PCB 70 to the plurality of electrical contacts 62 at the first surface 63 of the base PCB 60. In an operational block 116, a second riser PCB 80 comprising a plurality of electrical contacts 82 is coupled to the base PCB 60. In certain embodiments, coupling the second riser PCB 80 to the base PCB 60 comprises electrically coupling the electrical contacts 82 of the second riser PCB 80 to the plurality of electrical contacts 64 at the second surface 65 of the base PCB 60.

Figure 9:
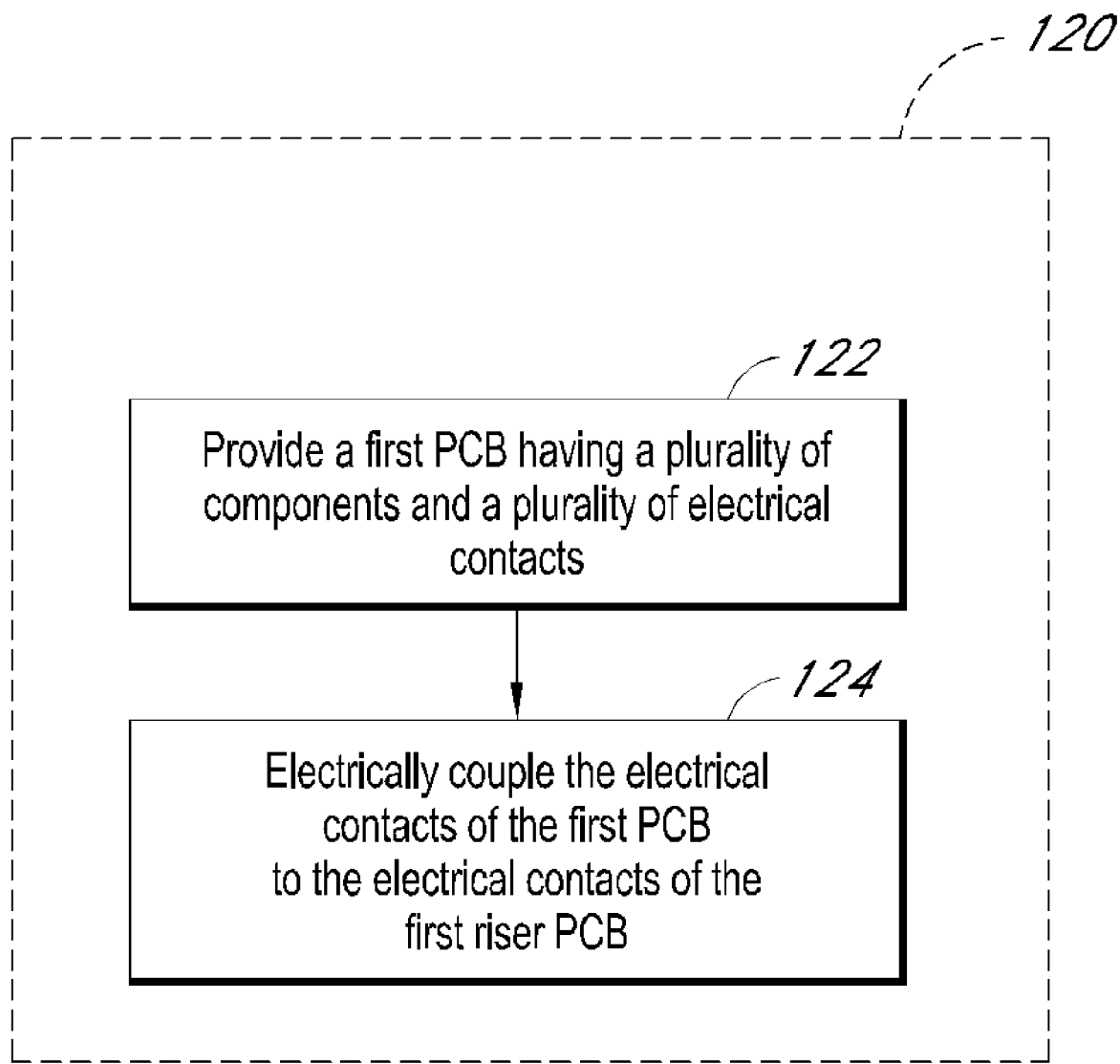
FIG. 9 is a flowchart of mounting the first PCB to the frame in accordance with certain embodiments described herein.

FIG. 9 is a flowchart of mounting the first PCB 30 to the frame 20 in the operational block 120 in accordance with certain embodiments described herein. In an operational block 122, the first PCB 30 is provided, wherein the first PCB 30 comprises a plurality of components 34, a plurality of electrical contacts 36 along an edge 37 of the first PCB 30, and a plurality of component contacts 38. The electrical contacts 36 are electrically coupled to the components 34 through the component contacts 38. In an operational block 124, the electrical contacts 36 are electrically coupled to the electrical contacts 72 of the first riser PCB 70.

Figure 10:
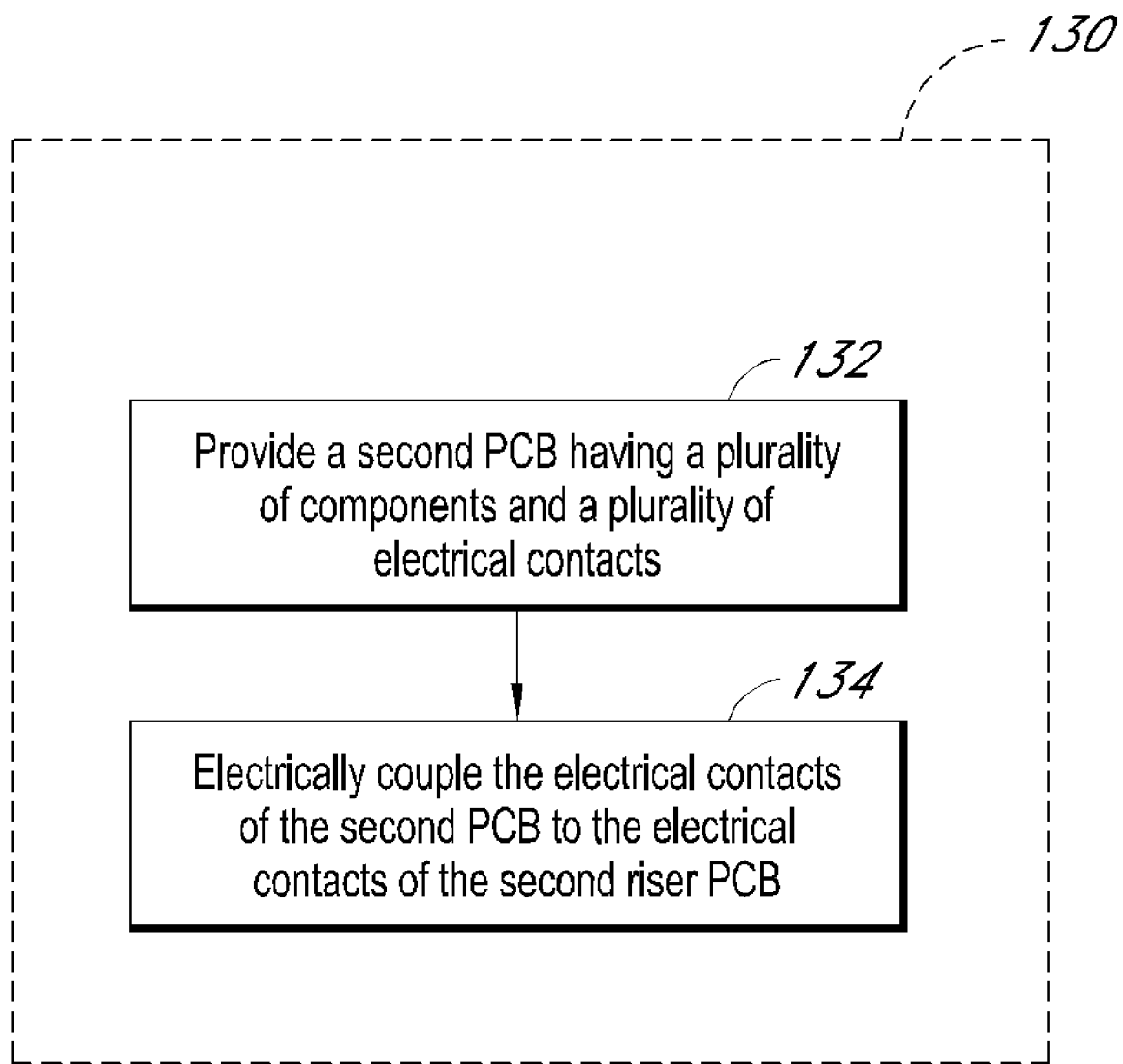
FIG. 10 is a flowchart of mounting the second PCB to the frame in accordance with certain embodiments described herein.

FIG. 10 is a flowchart of mounting the second PCB 40 to the frame 20 in the operational block 130 in accordance with certain embodiments described herein. In an operational block 132, the second PCB 40 is provided, wherein the second PCB 40 comprises a plurality of components 44, a plurality of electrical contacts 46 along an edge 47 of the second PCB 40, and a plurality of component contacts 48. The electrical contacts 46 are electrically coupled to the components 44 through the component contacts 48. In an operational block 134, the electrical contacts 46 are electrically coupled to the electrical contacts 82 of the second riser PCB 80.

Figure 11A:
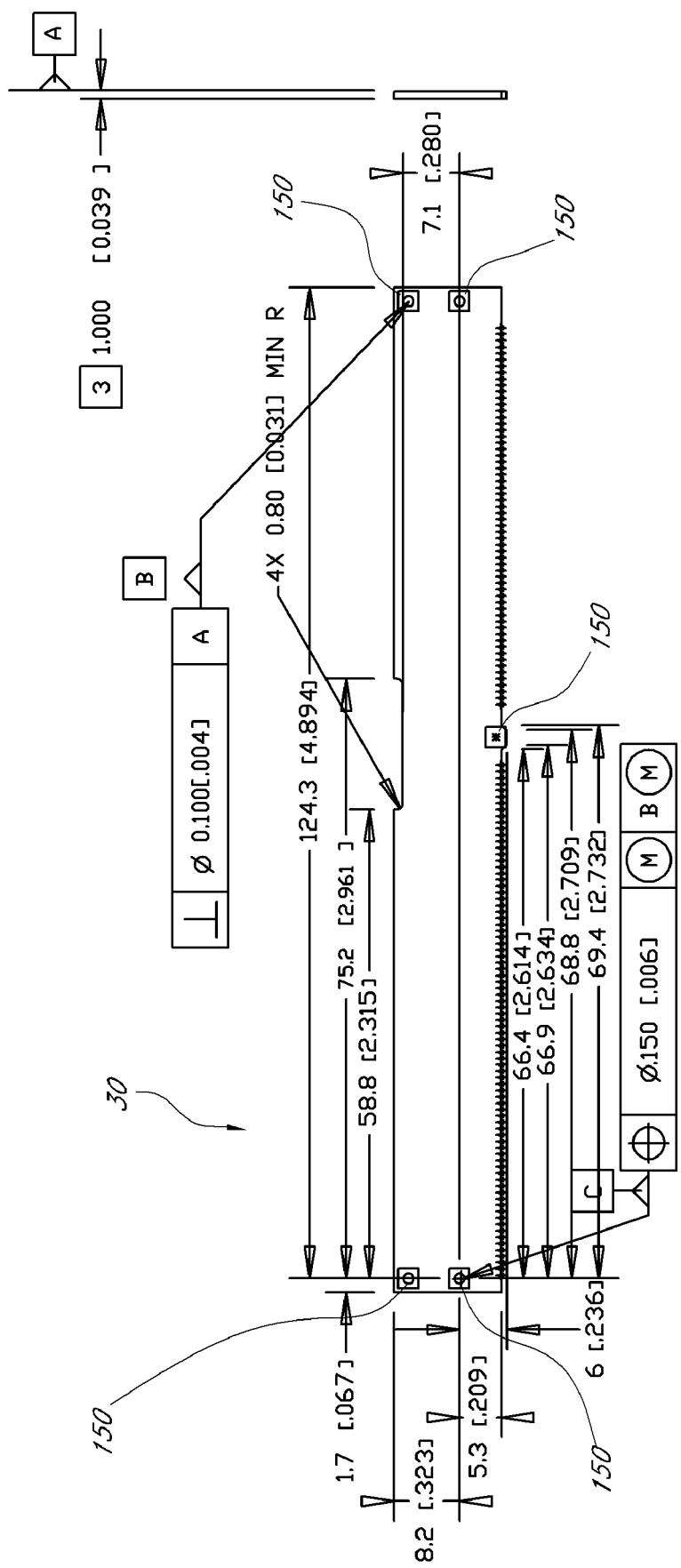
FIGS. 11A-11C schematically illustrate exemplary PCBs with holes which fit onto corresponding pins of a jig.
Figure 11B:
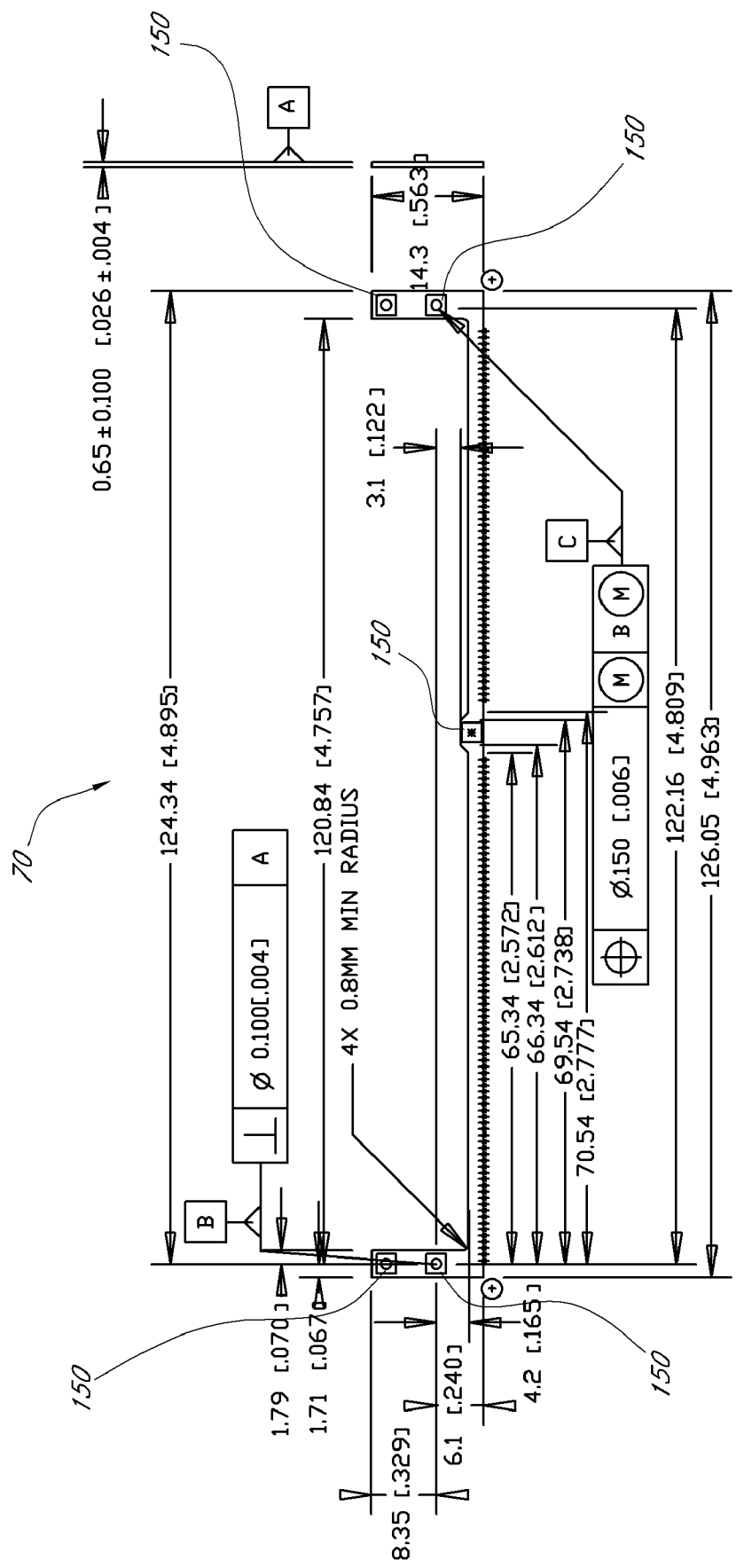
Figure 11C:
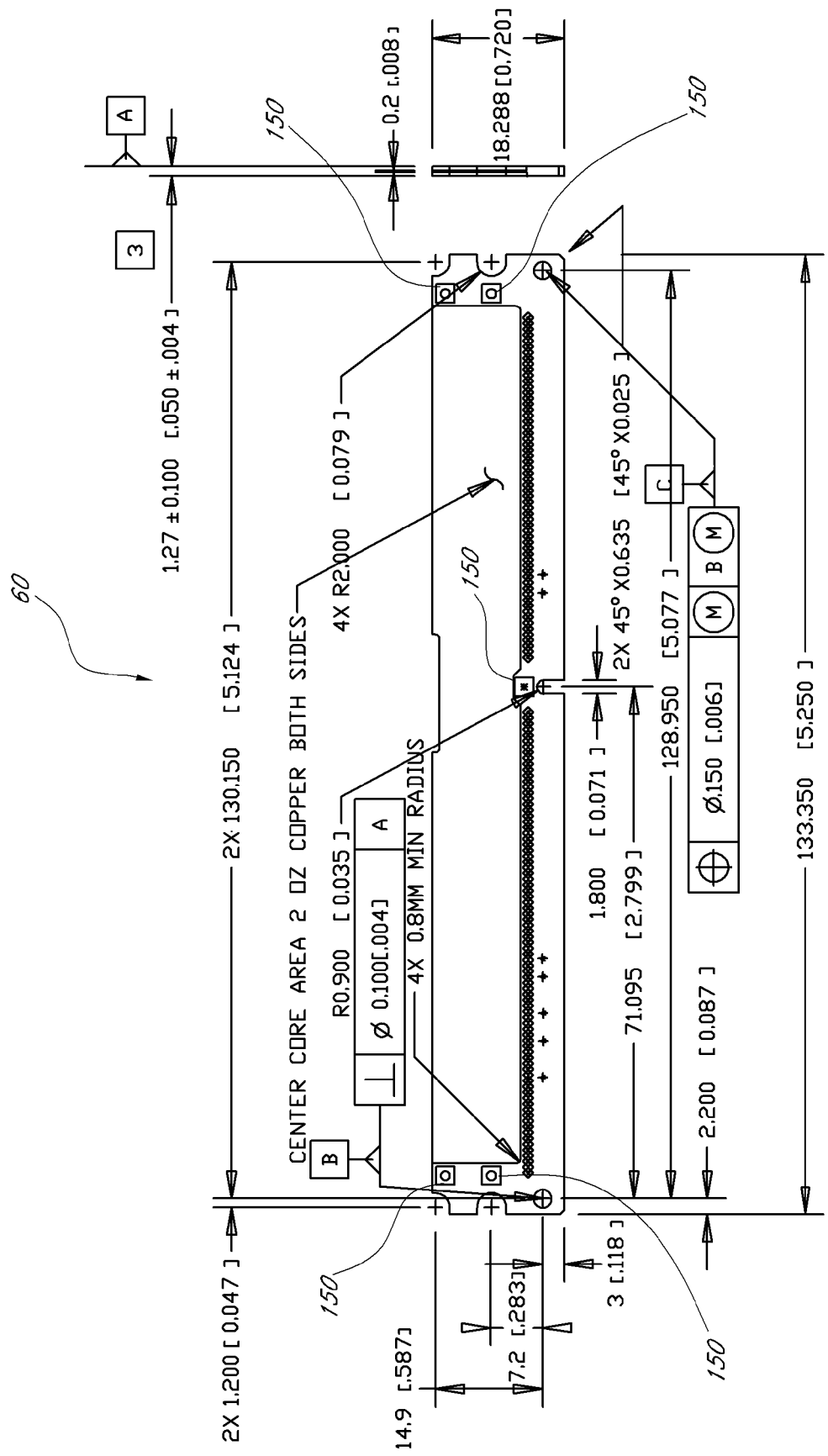

In certain embodiments, each PCB used to fabricate the module 10 (e.g., the first PCB 30, the second PCB 40, the base PCB 60, the first riser PCB 70, and the second riser PCB 80) has fiducial marks or structures which fit into a jig or other framework to facilitate orienting the PCBs relative to one another during fabrication. Examples of structures compatible with embodiments described herein include, but are not limited to, notches, ridges, pins, and holes. FIGS. 11A-11C schematically illustrate exemplary PCBs with holes 150 which fit onto corresponding pins of a jig (not shown). FIG. 11A schematically illustrates a first PCB 30 with a plurality of holes 150 at selected positions. FIG. 11B schematically illustrates a first riser PCB 70 with a plurality of holes 150 at corresponding positions. FIG. 11C schematically illustrates a base PCB 60 with a plurality of holes 150 at corresponding positions. Similarly, each of the second PCB 40 and the second riser PCB 80 of certain embodiments has a plurality of holes 150 at corresponding positions. Other embodiments have different numbers of holes 150 at different positions than those schematically illustrated by FIGS. 11A-11C. Persons skilled in the art can select appropriate hole sizes and positions in accordance with embodiments described herein.

Figure 12:
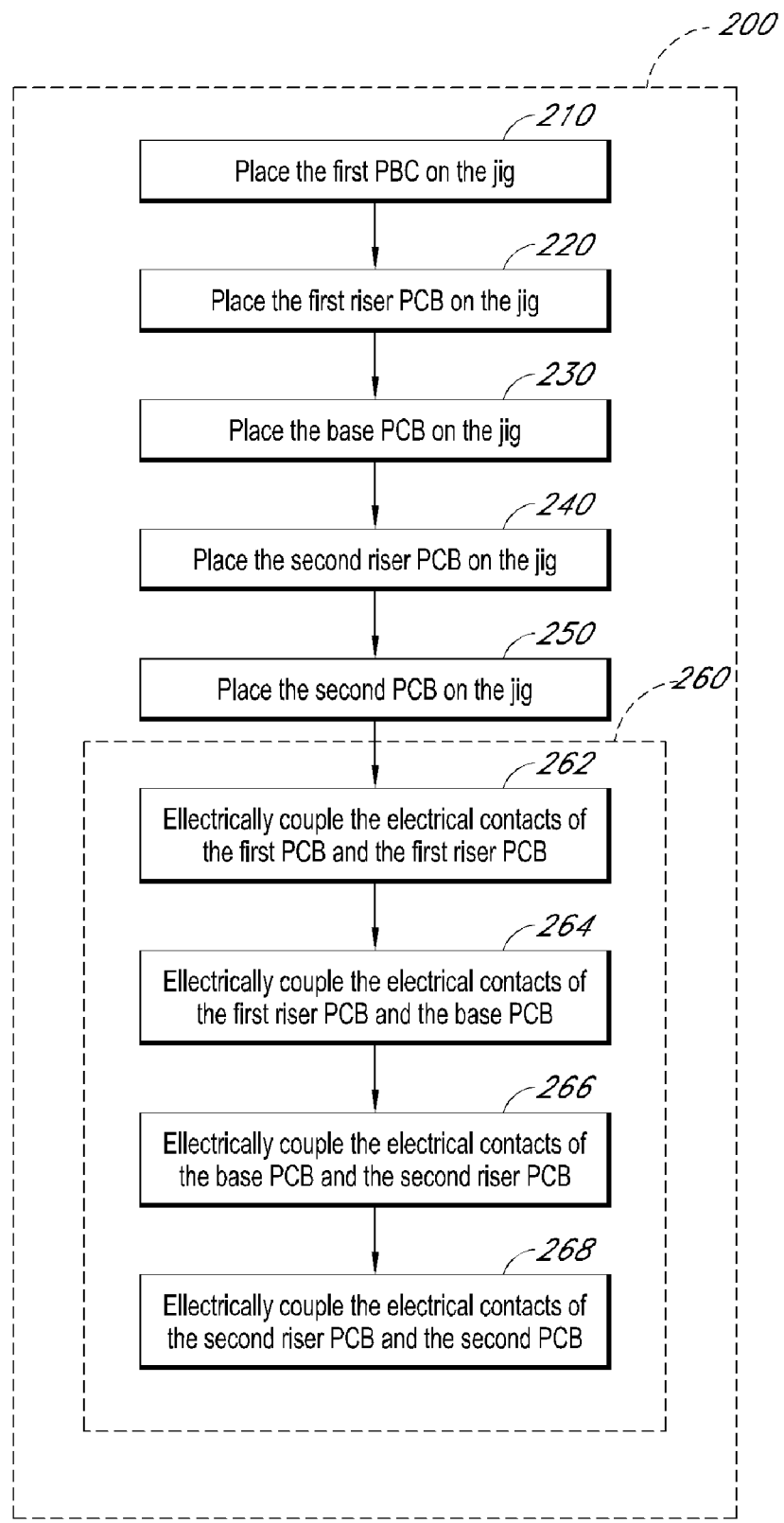
FIG. 12 is a flowchart of an exemplary fabrication method using a jig having pins corresponding to the holes of the PCBs schematically illustrated by FIGS. 11A-11C.

FIG. 12 is a flowchart of an exemplary fabrication method 200 using a jig having pins corresponding to the holes 150 of the PCBs schematically illustrated by FIGS. 11A-11C. In an operational block 210, the first PCB 30 is placed on the jig with the pins extending through the holes 150 of the first PCB 30. The first PCB 30 is placed on the jig with the first surface 32 facing upwards. In an operational block 220, the first riser PCB 70 is placed on the jig with the pins extending through the holes 150 of the first riser PCB 70. The electrical contacts 72 of the first riser PCB 70 are proximal to the electrical contacts 36 of the first PCB 30. In an operational block 230, the base PCB 60 is placed on the jig with the pins extending through the holes 150 of the base PCB 60. The electrical contacts 62 of the base PCB 60 are proximal to the electrical contacts 72 of the first riser PCB 70. The at least one thermally conductive layer 50 is thermally coupled to the components 34 of the first PCB 30. In certain embodiments, a thermally conductive grease is applied between the components 34 of the first PCB 30 and the at least one thermally conductive layer 50 prior to placing the base PCB 60 and the first PCB 30 together. The thermally conductive grease of certain embodiments advantageously facilitates thermal coupling between the components 34 and the at least one thermally conductive layer 50 of the frame 20.

In an operational block 240, the second riser PCB 80 is placed on the jig with the pins extending through the holes 150 of the second riser PCB 80. The electrical contacts 82 of the second riser PCB 80 are proximal to the electrical contacts 64 of the base PCB 60. In an operational block 250, the second PCB 40 is placed on the jig with the pins extending through the holes 150 of the second PCB 40. The electrical contacts 46 of the second PCB 40 are proximal to the electrical contacts 82 of the second riser PCB 80. The second PCB 40 is placed on the jig with the second surface 42 facing downwards. The at least one thermally conductive layer 50 is thermally coupled to the components 44 of the second PCB 40. In certain embodiments, a thermally conductive grease is applied between the top components 44 of the second PCB 40 and the at least one thermally conductive layer 50 prior to placing the base PCB 60 and the second PCB 40 together. The thermally conductive grease of certain embodiments advantageously facilitates thermal coupling between the components 44 and the at least one thermally conductive layer 50 of the frame 20.

In an operational block 260, the electrical contacts of the various PCBs are electrically coupled together to provide electrical conductivity between the edge connector 22 and the components 34, 44. In an operational block 262, the electrical contacts 36 of the first PCB 30 are electrically coupled to the electrical contacts 72 of the first riser PCB 70. In an operational block 264, the electrical contacts 72 of the first riser PCB 70 are electrically coupled to the electrical contacts 62 of the base PCB 60. In an operational block 266, the electrical contacts 64 of the base PCB 60 are electrically coupled to the electrical contacts 82 of the second riser PCB 80. In an operational block 268, the electrical contacts 82 of the second riser PCB 80 are electrically coupled to the electrical contacts 46 of the second PCB 40.

Examples of methods of electrically coupling the respective electrical contacts include, but are not limited to, edge-bonded interconnects (as described more fully below), through-hole interconnects, male-female connections, J-clips, and flex circuitry. Persons skilled in the art can select appropriate methods of electrically coupling the respective electrical contacts in accordance with embodiments described herein.

In particular, through-hole interconnects suffer from various problems. For example, solder joints used to provide the interconnection are located between the two PCBs, so the solder joints are not visible and are not accessible for visual inspection. In addition, the through-hole interconnects add to the cost of manufacturing the module 10. In addition, the through-hole interconnects do not provide reliable electrical interconnections between the two PCBs.

In certain embodiments utilizing edge-bonded interconnects, each of the first riser PCB 70 and the second riser PCB 80 has plated contacts in proximity to an edge of the PCB (e.g., either on the edge or cut into the edge, as schematically illustrated by FIG. 3C). In certain such embodiments, each of the operational blocks 262, 264, 266, 268 are performed by applying solder to the plated contacts and reflowing the solder using localized heating. By using localized heating, certain such embodiments advantageously avoid exposing the components 34, 44 to additional heat cycling, thereby reducing the probability of degradation or failure of the components 34, 44.

Figure 13:
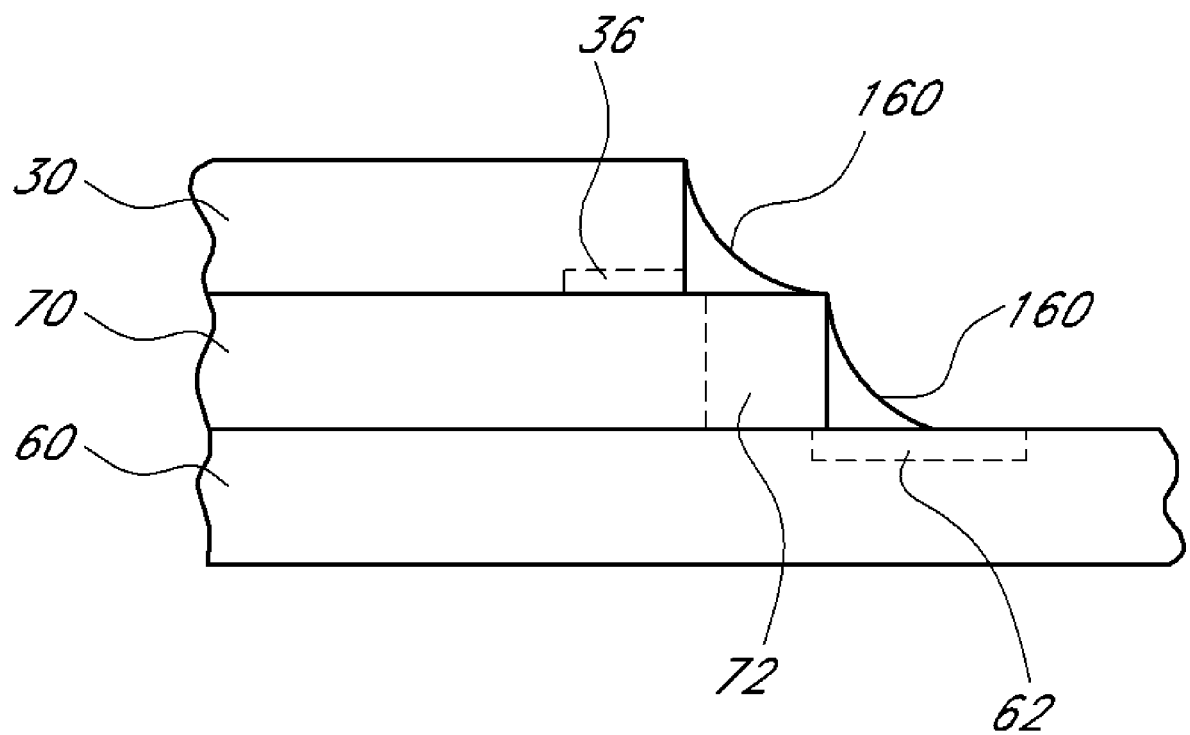
FIG. 13 schematically illustrates a side view of exemplary electrical connections between the electrical contacts of the base PCB, the electrical contacts of the first riser PCB, and the electrical contacts of the first PCB.

FIG. 13 schematically illustrates a side view of exemplary electrical connections between the electrical contacts 62 of the base PCB 60, the electrical contacts 72 of the first riser PCB 70, and the electrical contacts 36 of the first PCB 30 using edge-bonded interconnects. After applying solder 160 and reflowing the solder 160, the plated electrical contacts 62, 72, 36 in proximity to the edge of the PCBs are wetted by the solder 160, as schematically illustrated by FIG. 13. The edge-bonded interconnects of certain embodiments provide vertical connections between two PCBs. In certain embodiments, applying the solder 160 to the outside surfaces of the electrical contacts 62, 72, 36 advantageously permits visual inspection of the resultant electrical connections, thereby avoiding techniques such as x-ray analysis. The electrical connections between the electrical contacts 62 of the base PCB 60 and the electrical contacts 36 of the first PCB 30 are advantageously facilitated in certain embodiments by the form of the electrical contacts 72 of the first riser PCB 70, as schematically illustrated by FIG. 3C. Such structures for the electrical contacts 72 provide recesses into which the solder 160 advantageously reflows upon localized heating. In certain embodiments, the edge-bonded interconnects advantageously simplify the module and board design, and reduce the cost of manufacturing the module and the board. By providing interconnects which can be visually inspected, certain embodiments utilizing edge-bonded interconnects advantageously facilitate identification of poor interconnections which can be rejected or reworked.

As described above, in certain embodiments, the at least one thermally conductive layer 50 comprises two thermally conductive layers 50a, 50b on either side of a dielectric layer 61. FIGS. 2, 5, and 6 schematically illustrate such embodiments. In certain embodiments in which the two thermally conductive layers 50a, 50b are also electrically conductive, the two thermally conductive layers 50a, 50b are thermally and electrically coupled to the same electrical contacts 22 of the edge connector 24. In certain other embodiments, the two thermally conductive layers 50a, 50b are thermally and electrically coupled to two separate sets of the electrical contacts 22 of the edge connector 24. Thus, in certain such embodiments, the two thermally conductive layers 50a, 50b are electrically isolated from one another.

In certain embodiments, one thermally conductive layer 50a is thermally and electrically coupled to the electrical contacts 22 corresponding to a ground plane while the other thermally conductive layer 50b is thermally and electrically coupled to the electrical contacts 22 corresponding to a voltage plane. In certain embodiments, the frame 20 comprises between approximately twenty to thirty electrical contacts 22 to ground and between approximately twenty to thirty electrical contacts 22 to a power voltage. Thus, the number of electrical contacts 22 used to provide the thermal path is advantageously increased by connecting the thermally conductive layers 50a, 50b to different sets of electrical contacts 22. Certain such embodiments advantageously provide a degree of electromagnetic interference (EMI) shielding of the components 34, 44 of the module 10. Certain other such embodiments advantageously provide capacitance between the two thermally conductive layers 50a, 50b which facilitates noise reduction of the voltage applied to the voltage plane.

Figure 14:
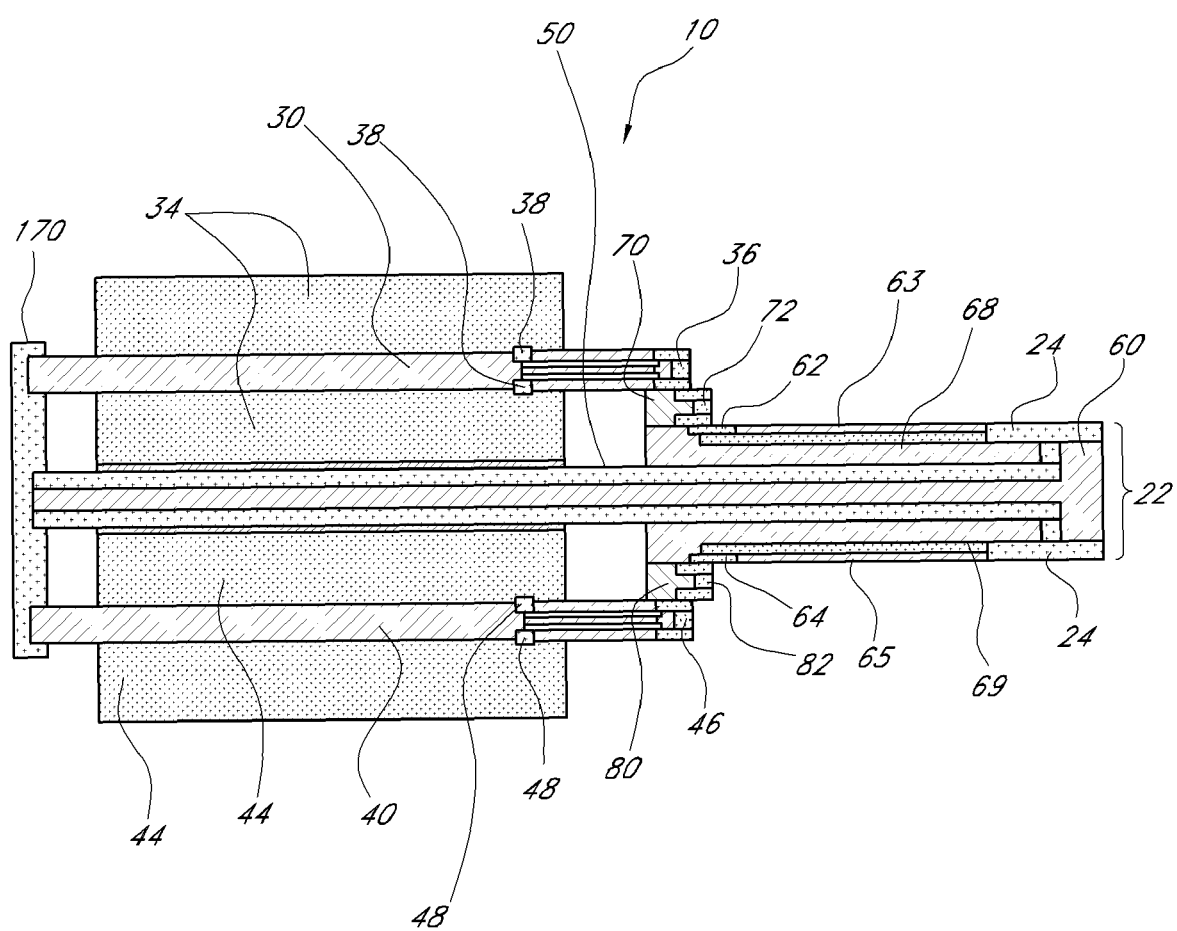
FIG. 14 schematically illustrates an exemplary module having a thermally conductive piece which is positioned on the module along a portion of the opposite edge away from the edge connector.

In certain embodiments, the module 10 further comprises a thermally conductive piece 170 which is positioned on the module 10 along a portion of the opposite edge away from the edge connector 22, as schematically illustrated by FIG. 14. The piece 170 is thermally coupled to the at least one thermally conductive layer 50 and provides a second thermal path for heat to transfer to the piece 170 from the components 34, 44, through the at least one thermally conductive layer 50. The heat can then be dissipated away from the piece 170 by convection to the environment surrounding the module 10.

Figure 15:
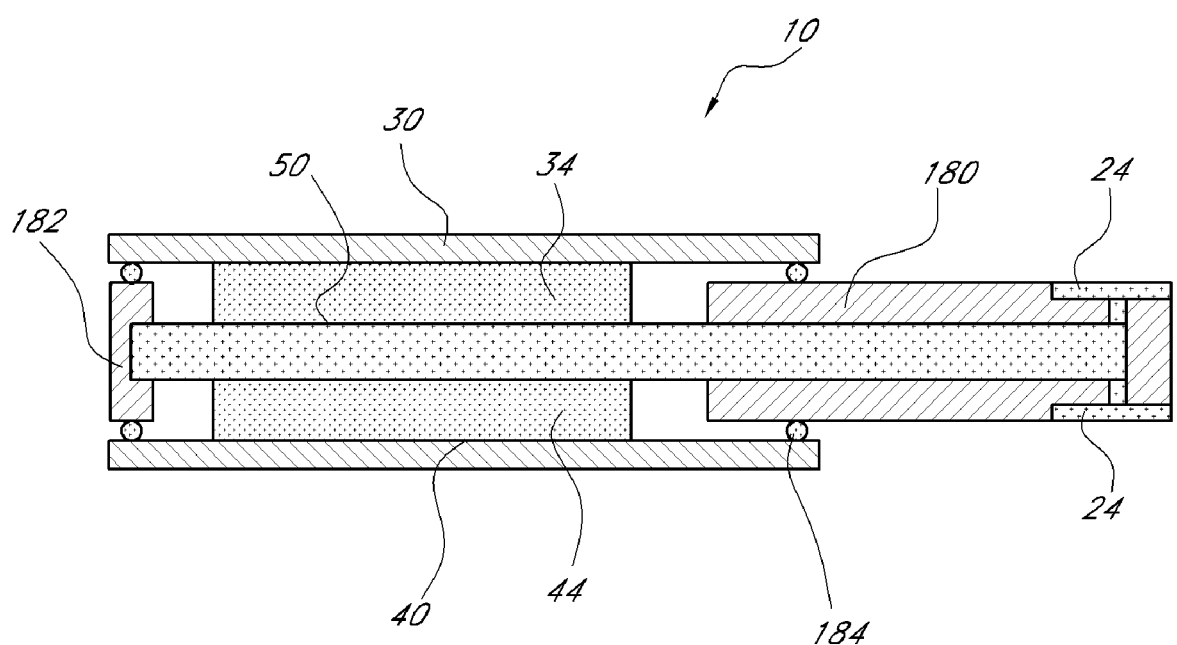
FIG. 15 schematically illustrates an exemplary frame having a first portion and a second portion in accordance with embodiments described herein.

FIG. 15 schematically illustrates an exemplary module 10 having a first frame portion 180 and a second frame portion 182 in accordance with embodiments described herein. The at least one thermally conductive layer 50 extends from the first portion 180 of the frame 20 to the second portion 182 of the frame 20. Each of the first PCB 30 and the second PCB 40 is coupled to both the first portion 180 of the frame 20 and the second portion 182 of the frame 20 (e.g., by solder balls 184). The at least one thermally conductive layer 50 is sandwiched between the components 34 of the first PCB 30 and the components 44 of the second PCB 40.

Various specific embodiments have been described above. Although the present invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A module electrically connectable to a computer system, the module comprising:
   a plurality of electrical contacts which are electrically connectable to the computer system;
   a first surface and a first plurality of circuits coupled to the first surface, the first plurality of circuits in electrical communication with the electrical contacts;
   a second surface and a second plurality of circuits coupled to the second surface, the second plurality of circuits in electrical communication with the electrical contacts, the second surface facing the first surface; and
   at least one thermally conductive layer positioned between the first surface and the second surface, the at least one thermally conductive layer in thermal communication with the first plurality of circuits, the second plurality of circuits, and a first set of electrical contacts of the plurality of electrical contacts.

2. The module of claim 1, wherein the at least one thermally conductive layer comprises copper.

3. The module of claim 1, further comprising at least one multilayer structure in electrical communication with the first plurality of circuits and with the second plurality of circuits.

4. The module of claim 3, wherein the at least one multilayer structure comprises an edge connector comprising the plurality of electrical contacts.

5. The module of claim 3, wherein the at least one multilayer structure comprises a lamination of layers of electrically insulative materials and electrically conductive materials.

6. The module of claim 1, wherein the at least one multilayer structure comprises the at least one thermally conductive layer.

7. The module of claim 1, wherein the first surface and the second surface are generally parallel to one another.

8. The module of claim 1, wherein the first plurality of circuits comprises memory integrated circuits and the second plurality of circuits comprises memory integrated circuits.

9. A module connectable to a computer system, the module comprising:
   a first surface and a first plurality of circuits coupled to the first surface, the first plurality of circuits in electrical communication with the computer system when the module is connected to the computer system;
   a second surface and a second plurality of circuits coupled to the second surface, the second plurality of circuits in electrical communication with the computer system when the module is connected to the computer system, the second surface facing the first surface; and
   a heat spreader comprising at least one sheet of thermally conductive material, the heat spreader between the first surface and the second surface and in thermal communication with the first plurality of circuits and the second plurality of circuits, the heat spreader in thermal communication with the computer system when the module is connected to the computer system.

10. The module of claim 9, wherein the thermally conductive material comprises copper.

11. The module of claim 9, further comprising at least one multilayer structure in electrical communication with the first plurality of circuits and with the second plurality of circuits.

12. The module of claim 11, wherein the at least one multilayer structure comprises an edge connector comprising a plurality of electrical contacts in electrical communication with the computer system when the module is connected to the computer system.

13. The module of claim 12, wherein the at least one multilayer structure further comprises the heat spreader.

14. The module of claim 11, wherein the at least one multilayer structure comprises a lamination of layers of electrically insulative materials and electrically conductive materials.

15. A method of conducting heat away from a first plurality of circuits coupled to a first surface of a module and from a second plurality of circuits coupled to a second surface of the module, the method comprising:
   coupling the first plurality of circuits and the second plurality of circuits to a plurality of electrical contacts;
   positioning a thermally conductive layer between the surface and the second surface, the first surface facing the second surface; and
   thermally coupling the thermally conductive layer to the first plurality of circuits, to the second plurality of circuits, and to the plurality of electrical contacts.

16. The method of claim 15, further comprising electrically and thermally coupling the plurality of electrical contacts to a computer system, thereby providing a thermal pathway for heat to be removed from the first plurality of circuits and from the second plurality of circuits to the computer system through the plurality of electrical components.

17. A method of fabricating a module electrically connectable to a computer system, the method comprising:
- providing a plurality of electrical contacts electrically connectable to the computer system;
- providing at least one layer of thermally conductive material which is thermally coupled to the plurality of electrical contacts, the at least one layer of thermally conductive material thermally coupled to the computer system when the plurality of electrical contacts is electrically connected to the computer system;
- providing a first surface and a first plurality of circuits coupled to the first surface;
- providing a second surface and a second plurality of circuits coupled to the second surface;
- electrically coupling the first plurality of circuits and the second plurality of circuits to the plurality of electrical contacts; and
- thermally coupling the first plurality of circuits and the second plurality of circuits to the at least one layer of thermally conductive material, wherein the first surface and the second surface are facing one another and the at least one layer of thermally conductive material is between the first surface and the second surface.

18. A memory module comprising:
- at least one thermally conductive layer;
- a first side facing the at least one thermally conductive layer, the first side having a first plurality of circuits coupled thereto, the first plurality of circuits in thermal communication with the at least one thermally conductive layer;
- a second side facing the at least one thermally conductive layer, the second side having a second plurality of circuits coupled thereto, the second plurality of circuits in thermal communication with the at least one thermally conductive layer, wherein the at least one thermally conductive layer is between the first side and the second side.

19. The memory module of claim 18, further comprising a third side facing away from the first side, the third side having a third plurality of circuits coupled thereto.

20. The memory module of claim 19, further comprising a fourth side facing away from the second side, the fourth side having a fourth plurality of circuits coupled thereto.

* * * * *